(12) United States Patent
Takagi

(10) Patent No.: US 11,061,309 B2
(45) Date of Patent: Jul. 13, 2021

(54) COOLING DEVICE HAVING EVAPORATOR WITH GROOVE MEMBER, AND PROJECTOR

(71) Applicant: SEIKO EPSON CORPORATION, Tokyo (JP)

(72) Inventor: Kunihiko Takagi, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 69 days.

(21) Appl. No.: 16/662,152

(22) Filed: Oct. 24, 2019

(65) Prior Publication Data
US 2020/0133107 A1    Apr. 30, 2020

(30) Foreign Application Priority Data
Oct. 25, 2018    (JP) .............................. JP2018-201055

(51) Int. Cl.
*G03B 21/16* (2006.01)
*H04N 9/31* (2006.01)
(Continued)

(52) U.S. Cl.
CPC ......... *G03B 21/16* (2013.01); *F28D 15/0266* (2013.01); *F28D 15/043* (2013.01);
(Continued)

(58) Field of Classification Search
CPC .............. G03B 21/16; H05K 7/20309; H05K 7/20318; H05K 7/20327; H05K 7/20336;
(Continued)

(56) References Cited

U.S. PATENT DOCUMENTS 6,915,843 B2 * 7/2005 Kroliczek ........... F28D 15/0233
165/104.26
2002/0029873 A1 * 3/2002 Sugito ..................... F28F 13/06
165/166
(Continued)

FOREIGN PATENT DOCUMENTS

JP    H06-194075 A    7/1994
JP    2008-281229 A    11/2008
(Continued)

*Primary Examiner* — Michelle M Iacoletti
*Assistant Examiner* — Magda Cruz
(74) *Attorney, Agent, or Firm* — Oliff PLC

(57) ABSTRACT

A cooling device includes an evaporator. The evaporator includes a housing having a reserver, a wick and a groove member having a plurality of vapor flow channels through which the working fluid changed in phase from the liquid phase to the vapor phase flows. The groove member is constituted by alternately stacking two or more first metal plates coupled to the wick and two or more second metal plates disposed at a larger distance from the wick than that of the first metal plate. One vapor flow channels is formed between the first metal plates adjacent to each other at the wick side of the groove member. A dimension along the first direction is larger than a dimension along the second direction in a cross-sectional surface of the vapor flow channel when viewing the groove member along a direction perpendicular to both the first direction and the second direction.

9 Claims, 18 Drawing Sheets

(51) Int. Cl.
*H05K 7/20* (2006.01)
*F28D 15/04* (2006.01)
*F28D 15/02* (2006.01)
*F28D 20/02* (2006.01)

(52) U.S. Cl.
CPC ......... *F28D 15/046* (2013.01); *F28D 20/023* (2013.01); *H04N 9/3144* (2013.01); *H05K 7/20309* (2013.01); *H05K 7/20318* (2013.01); *H05K 7/20327* (2013.01); *H05K 7/20336* (2013.01)

(58) Field of Classification Search
CPC .. F28D 15/0266; F28D 15/043; F28D 20/023; F28D 15/046; H04N 9/3144
See application file for complete search history.

(56) References Cited

U.S. PATENT DOCUMENTS

| | | | | |
|---|---|---|---|---|
| 2003/0042009 | A1* | 3/2003 | Phillips | H01L 23/427 165/104.26 |
| 2005/0135062 | A1* | 6/2005 | Kiley | F28D 15/0266 361/700 |
| 2005/0257532 | A1* | 11/2005 | Ikeda | F25B 21/02 62/3.7 |
| 2006/0181848 | A1* | 8/2006 | Kiley | F28D 15/0275 361/697 |
| 2008/0277099 | A1 | 11/2008 | Takamatsu et al. | |
| 2009/0020274 | A1* | 1/2009 | Kawabata | F28D 15/0233 165/168 |
| 2009/0097206 | A1* | 4/2009 | Tomioka | F28D 15/0233 361/701 |
| 2010/0186931 | A1 | 7/2010 | Obara et al. | |
| 2010/0300656 | A1* | 12/2010 | Lu | F28D 15/046 165/104.26 |
| 2013/0083482 | A1* | 4/2013 | Uchida | H01L 23/427 361/696 |
| 2014/0318167 | A1* | 10/2014 | Uchida | F28D 15/04 62/259.2 |
| 2016/0262288 | A1* | 9/2016 | Chainer | H05K 7/20809 |
| 2019/0203983 | A1* | 7/2019 | Jeon | F28D 15/0275 |
| 2019/0390918 | A1* | 12/2019 | Hirasawa | H05K 7/20336 |
| 2020/0073217 | A1* | 3/2020 | Shimizu | F28D 15/0266 |

FOREIGN PATENT DOCUMENTS

| | | |
|---|---|---|
| JP | 2009-024933 A | 2/2009 |
| JP | 2009-097757 A | 5/2009 |
| JP | 2012-083082 A | 4/2012 |
| JP | 2014-062658 A | 4/2014 |
| JP | 2016-142416 A | 8/2016 |
| JP | 2018-110200 A | 7/2018 |
| WO | 2008/153071 A1 | 12/2008 |

* cited by examiner

FIG. 11
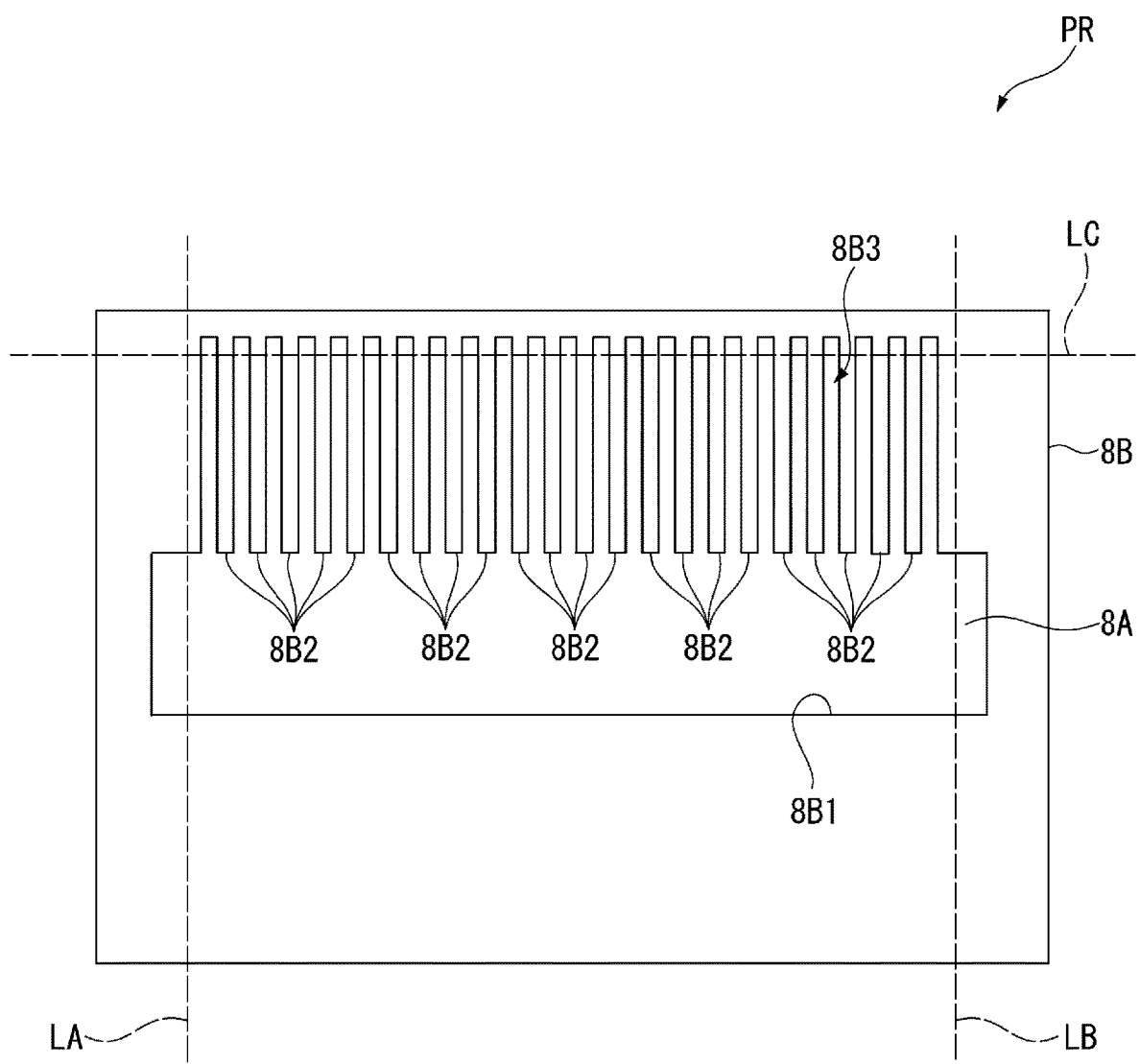
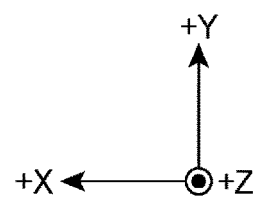

COOLING DEVICE HAVING EVAPORATOR WITH GROOVE MEMBER, AND PROJECTOR

The present application is based on, and claims priority from JP Application Serial Number 2018-201055, filed Oct. 25, 2018, the disclosure of which is hereby incorporated by reference herein in its entirety.

BACKGROUND

1. Technical Field

The present disclosure relates to a cooling device and a projector.

2. Related Art

In the past, as a cooling device used for cooling an electronic device or the like, there has been known a loop heat pipe which transfers the heat received from a cooling target to a working fluid as a cooling medium flowing through a circulation channel, and then discharges the heat transferred to the working fluid with another region to thereby cool the cooling target . As such a loop heat pipe, there has been known a circulatory cooling device having an evaporator, a vapor pipe, a condenser, and a liquid pipe circularly coupled to each other (see, e.g., JP-A-2008-281229 (Document 1)).

The evaporator in the circulatory cooling device described in Document 1 is a device which is coupled to a heating element so as to be able to transfer the heat to draw the heat from the heating element due to the evaporative latent heat of the cooling medium provided inside the evaporator. The evaporator is constituted by a cooling medium supply section at the liquid pipe side and a heat transfer section at a vapor pipe side. Inside the heat transfer section, there is housed a wick, and in addition, there is disposed a plurality of heat transfer fins projecting toward the wick.

The wick is formed of a porous body, sintered metal, or the like. The wick moves the cooling medium housed by a cooling medium supply section toward the plurality of heat transfer fins due to a capillary force.

The wick and upper surfaces of the plurality of fins adhere to each other, the heat from the heating element is transferred to the cooling medium to cause the cooling medium to change in phase, and the vapor generated passes between the heat transfer fins to flow into the vapor pipe.

In the evaporator used for the loop heat pipe, the plurality of heat transfer fins in the heat transfer section described in Document 1 is formed by, for example, performing cutting work on metal.

However, when performing the work on the metal to form the plurality of heat transfer fins, it is difficult to increase the cross-sectional area of a flow channel which is formed between the heat transfer fins, and through which the working fluid in the vapor phase flows. Therefore, there is a problem that a pressure loss occurring when discharging the working fluid in the vapor phase is high, the evaporation temperature at which the working fluid changes from the liquid phase to the vapor phase rises, and it is difficult to cool the cooling target.

In contrast, when increasing the distance between the heat transfer fins to increase the cross-sectional area of the flow channel, the number of end parts of the heat transfer fins having contact with the wick decreases. Since the phase change of the working fluid from the liquid phase to the vapor phase mainly occurs in the end parts, there is a problem that an amount of the working fluid changing from the liquid phase to the vapor phase decreases, and it is difficult to cool the cooling target.

SUMMARY

A cooling device according to a first aspect of the present disclosure includes an evaporator configured to evaporate working fluid in a liquid phase with a heat transferred from a cooling target to change to the working fluid in a vapor phase, a condenser configured to condense the working fluid in the vapor phase to change to the working fluid in the liquid phase, a vapor pipe configured to flow the working fluid changed to the vapor phase in the evaporator into the condenser, and a liquid pipe configured to flow the working fluid changed to the liquid phase in the condenser into the evaporator, wherein the evaporator includes a housing coupled to the liquid pipe, the housing into which the working fluid in the liquid phase inflows, the housing having a reservoir configured to retain the working fluid in the liquid phase flowed into the housing, a wick disposed in the housing, the wick soaked with the working fluid in the liquid phase, the wick configured to transport the working fluid in the liquid phase, a groove member having a plurality of vapor flow channels through which the working fluid changed in phase from the liquid phase to the vapor phase flows, the groove member coupled to the wick, the groove member is constituted by alternately stacking, along a second direction perpendicular to a first direction from the groove member toward the reservoir, two or more first metal plates coupled to the wick and two or more second metal plates disposed at a larger distance from the wick than that of the first metal plate, one vapor flow channel is formed between one of the first metal plates and another of the first metal plates adjacent to the one of the first metal plates at the wick side of the groove member, and a dimension along the first direction is larger than a dimension along the second direction in a cross-sectional surface of each of the vapor flow channels when viewing the groove member along a direction perpendicular to both the first direction and the second direction.

In the first aspect described above, a thermal conductivity of the first metal plate may be higher than a thermal conductivity of the second metal plate.

In the first aspect described above, the groove member and the wick may be integrated with each other.

In the first aspect described above, the wick may be constituted by alternately stacking, along the second direction, the plurality of first metal plates and a plurality of third metal plates each disposed at a first direction side with respect to the second metal plate, and the third metal plates may be combined with the first metal plates and form a plurality of transport flow channels configured to transport the working fluid in the liquid phase retained in the reservoir in an opposite direction to the first direction.

A projector according to a second aspect of the present disclosure includes a light source configured to emit light, a light modulator configured to modulate the light emitted from the light source, a projection optical device configured to project the light modulated by the light modulator, and anyone of the cooling devices described above.

In the second aspect of the present disclosure, the cooling target may be the light source.

BRIEF DESCRIPTION OF THE DRAWINGS

FIG. 11 is a diagram for explaining a process in a manufacturing process of the vapor generator in the second embodiment.

DESCRIPTION OF EXEMPLARY
EMBODIMENTS

First Embodiment

Figure 1:
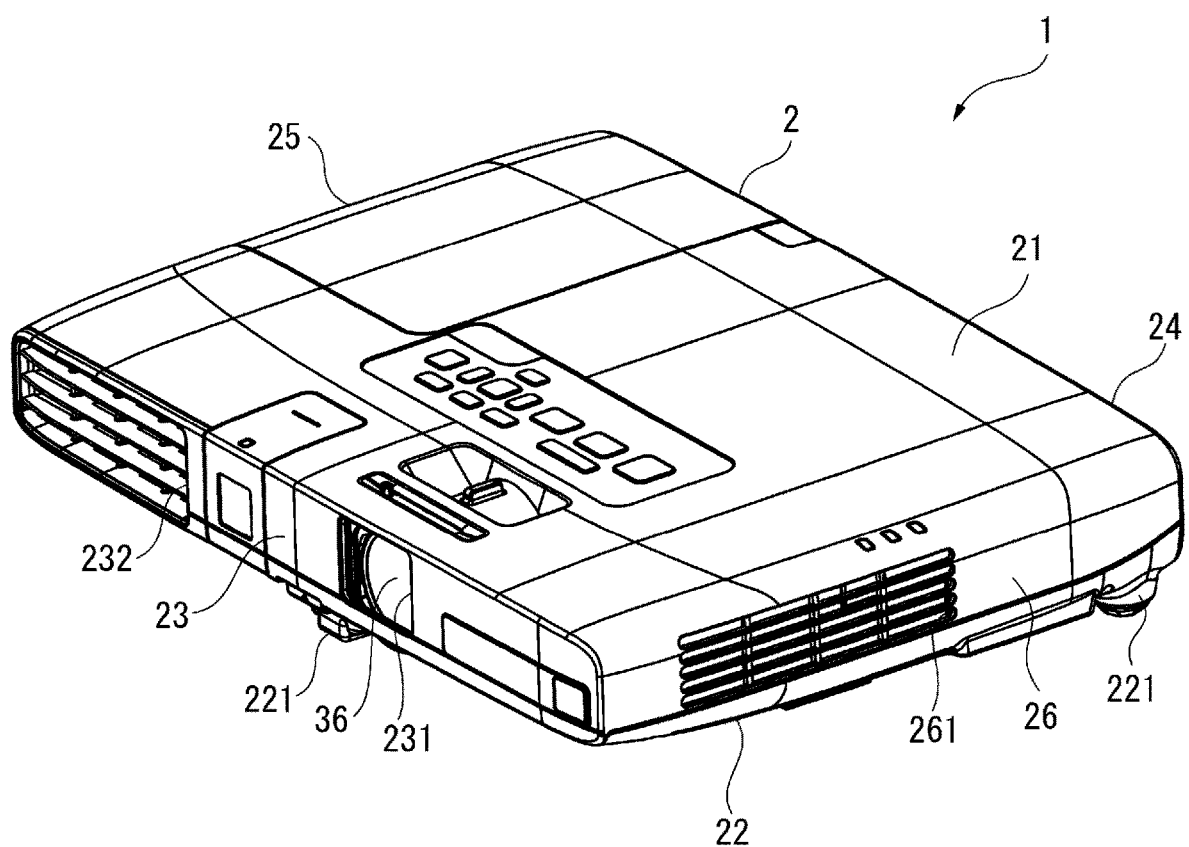
FIG. 1 is a perspective view showing an external appearance of a projector according to a first embodiment.

A first embodiment of the present disclosure will hereinafter be described based on the drawings.
Schematic Configuration of Projector FIG. 1 is a perspective view showing the appearance of the projector 1 according to the present embodiment.

The projector 1 according to the present embodiment is an image display device for modulating the light emitted from a light source device 4 described later to form an image corresponding to image information, and then projecting the image thus formed on a projection target surface such as a screen in an enlarged manner. As shown in FIG. 1, the projector 1 is provided with an exterior housing 2 constituting the exterior of the projector 1.
Configuration of Exterior Housing The exterior housing 2 has a top surface part 21, a bottom surface part 22, a front surface part 23, a back surface part 24, a left side surface part 25 and a right side surface part 26, and is formed to have a substantially rectangular solid shape.

The bottom surface part 22 has a plurality of leg parts 221 having contact with an installation surface on which the projector 1 is mounted.

The front surface part 23 is located on the projection side of an image in the exterior housing 2. The front surface part 23 has an opening part 231 for exposing a part of a projection optical device 36 described later, and the image to be projected by the projection optical device 36 passes through the opening part 231. Further, the front surface part 23 has an exhaust port 232 from which a cooling gas having cooled the cooling target in the projector 1 is discharged to the outside of the exterior housing 2.

The right side surface part 26 has an introduction port 261 from which a gas such as air located outside the exterior housing 2 is introduced inside as the cooling gas.
Internal Configuration of Projector FIG. 2 is a schematic diagram showing an internal configuration of the projector 1.

Figure 2:
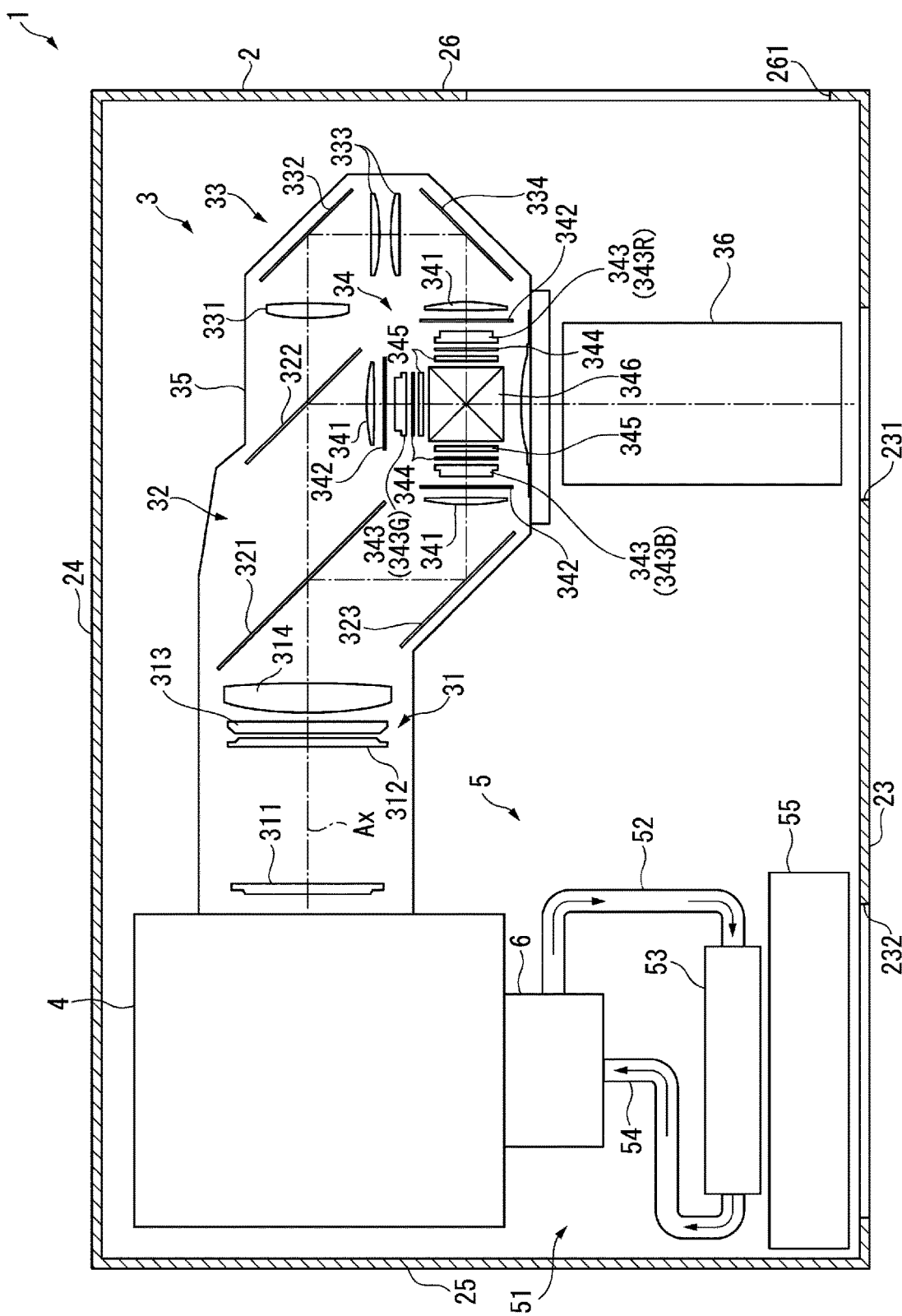
FIG. 2 is a schematic diagram showing an internal configuration of the projector according to the first embodiment.

As shown in FIG. 2, the projector 1 is further provided with an image projection device 3 and a cooling device 5 each housed inside the exterior housing 2. Besides the above, although not shown in the drawing, the projector 1 is provided with a control device for controlling an operation of the projector 1, and a power supply device for supplying electronic components of the projector 1 with electrical power.
Configuration of Image Projection Device The image projection device 3 forms and then projects the image corresponding to the image information input from the control device. The image projection device 3 is provided with a light source device 4, a homogenizing device 31, a color separation device 32, a relay device 33, an image forming device 34, an optical component housing 35, and a projection optical device 36.

The light source device 4 emits illumination light. A configuration of the light source device 4 will be described later in detail.

The homogenizing device 31 homogenizes the illumination light emitted from the light source device 4. The illumination light thus homogenized illuminates modulation areas of light modulation devices 343 described later of the image forming device 34 via the color separation device 32 and the relay device 33. The homogenizing device 31 is provided with two lens arrays 311, 312, a polarization conversion element 313, and a superimposing lens 314.

The color separation device 32 separates the light having entered the color separation device 32 from the homogenizing device 31 into colored light beams of red, green, and blue. The color separation device 32 is provided with two dichroic mirrors 321, 322, and a reflecting mirror 323 for reflecting the blue light beam having been separated by the dichroic mirror 321.

The relay device 33 is disposed on a light path of the red light beam longer than light paths of other colored light beams to suppress a loss of the red light beam. The relay device 33 is provided with an incident side lens 331, relay lenses 333, and reflecting mirrors 332, 334. It should be noted that in the present embodiment, it is assumed that the colored light beam longer in light path than other colored light beams is the red light beam, and the relay device 33 is disposed on the light path of the red light beam. However, this is not a limitation, and it is also possible to adopt a configuration in which, for example, the colored light beam longer in light path than other colored light beams is the blue light beam, and the relay device 33 is disposed on the light path of the blue light beam.

The image forming device 34 modulates each of the colored light beams of red, green and blue having entered the image forming device 34, and combines the colored light beams thus modulated with each other to form the image. The image forming device 34 is provided with three field lenses 341, three incident side polarization plates 342, three light modulation devices 343, three view angle compensation plates 344 and three exit side polarization plates 345 each disposed in accordance with the respective colored light beams entering the image forming device 34, and a single color combining device 346.

The light modulation devices 343 each modulate the light emitted from the light source device 4 in accordance with the image information. The light modulation devices 343 include the light modulation device 343R for the red light beam, the light modulation device 343G for the green light beam, and the light modulation device 343B for the blue light beam. In the present embodiment, the light modulation devices 343 are each formed of a transmissive liquid crystal panel, and the incident side polarization plate 342, the light modulation device 343 and the exit side polarization plate 345 constitute a liquid crystal light valve.

The color combining device 346 combines the colored light beams respectively modulated by the light modulation devices 343B, 343G and 343R with each other to form the image. In the present embodiment, the color combining device 346 is formed of a cross dichroic prism, but this is not a limitation, and it is also possible for the color combining device 346 to be formed of, for example, a plurality of dichroic mirrors.

The optical component housing 35 houses the devices 31 through 34 described above inside. It should be noted that an illumination light axis Ax as a design optical axis is set to the image projection device 3, and the optical component housing 35 holds the devices 31 through 34 at predetermined positions on the illumination light axis Ax. It should be noted that the light source device 4 and the projection optical device 36 are disposed at predetermined positions on the illumination light axis Ax.

The projection optical device 36 projects the image, which enters the projection optical device 36 from the image forming device 34, on the projection target surface in an enlarged manner. In other words, the projection optical device 36 projects the light beams, which have respectively been modulated by the light modulation devices 343B, 343G, and 343R. The projection optical device 36 is configured as a combination lens composed of a plurality of lenses housed in a lens tube having a cylindrical shape, for example.

Configuration of Light Source Device

Figure 3:
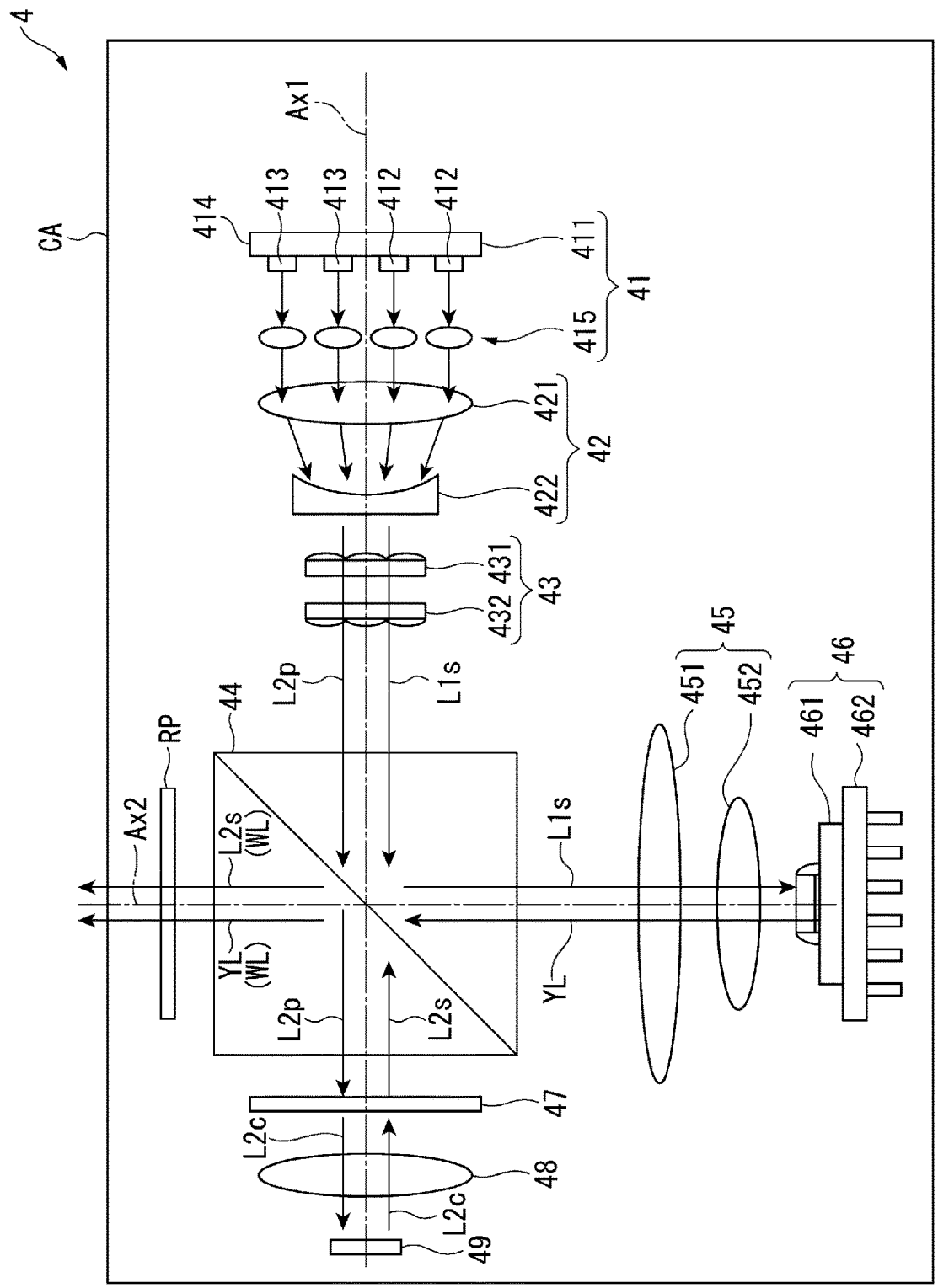
FIG. 3 is a schematic diagram showing a configuration of a light source device in the first embodiment.

FIG. 3 is a schematic diagram showing a configuration of the light source device 4.

The light source device 4 emits the illumination light to the homogenizing device 31. As shown in FIG. 3, the light source device 4 is provided with a light source housing CA, and a light source 41, an afocal optical element 42, a homogenizer optical element 43, a polarization split element 44, a first light collection element 45, a wavelength conversion element 46, a first retardation element 47, a second light collection element 48, a diffusely reflecting device 49 and a second retardation element RP each housed inside the light source housing CA.

The light source housing CA is configured as a sealed housing difficult for dust or the like to enter the inside thereof.

The light source 41, the afocal optical element 42, the homogenizer optical element 43, the polarization split element 44, the first retardation element 47, the second light collection element 48, and the diffusely reflecting device 49 are arranged on an illumination light axis Ax1 set in the light source device 4.

The wavelength conversion element 46, the first light collection element 45, the polarization split element 44, and the second retardation element RP are set in the light source device 4, and are arranged on an illumination light axis Ax2 perpendicular to the illumination light axis Ax1.

Configuration of Light Source

The light source 41 is provided with a light source 411 for emitting the light, and collimator lenses 415.

The light source 411 is provided with a plurality of first semiconductor lasers 412 and a plurality of second semiconductor lasers 413, and a support member 414.

The first semiconductor lasers 412 each emit blue light L1$s$, which is s-polarized light, as excitation light. The blue light L1$s$ is, for example, a laser beam with a peak wavelength of 440 nm. The blue light L1$s$ having been emitted from the first semiconductor lasers 412 enters the wavelength conversion element 46.

The second semiconductor lasers 413 each emit blue light L2$p$, which is p-polarized light. The blue light L2$p$ is, for example, a laser beam with a peak wavelength of 460 nm. The blue light L2$p$ having been emitted from the second semiconductor lasers 413 enters the diffusely reflecting device 49.

The support member 414 supports the plurality of first semiconductor lasers 412 and the plurality of second semiconductor lasers 413 each arranged in an array in a plane perpendicular to the illumination light axis Ax1. The support member 414 is a member made of metal having thermal conductivity, and is coupled to an evaporator 6 described later. Then, the heat of each of the semiconductor lasers 412, 413, namely the heat of the light source 411, as a heat source is transferred to the evaporator 6.

The blue light L1$s$ having been emitted from the first semiconductor lasers 412 and the blue light L2$p$ having been emitted from the second semiconductor lasers 413 are converted by the collimator lenses 415 into parallel light beams, and then enter the afocal optical element 42.

It should be noted that in the present embodiment, the light source 411 has a configuration of emitting the blue light L1$s$ as the s-polarized light and the blue light L2$p$ as the p-polarized light. However, this is not a limitation, and the light source 411 can also be provided with a configuration of emitting a blue light beam, which is a linearly polarized light beam the same in polarization direction. In this case, it is sufficient to dispose a retardation element, which changes one type of linearly polarized light having entered the retardation element to light including s-polarized light and p-polarized light, between the light source 41 and the polarization split element 44.

Configuration of Afocal Optical Element and Homogenizer Optical Element

The afocal optical element 42 adjusts the beam diameter of the blue light L1$s$, L2$p$ which enters the afocal optical element 42 from the light source 41, and then makes the blue light L1$s$, L2$p$ enter the homogenizer optical element 43. The afocal optical element 42 is constituted by a lens 421 for collecting the incident light, and a lens 422 for collimating the light beam collected by the lens 421.

The homogenizer optical element 43 homogenizes the illuminance distribution of the blue light L1$s$, L2$p$. The homogenizer optical element 43 is formed of a pair of multi-lens arrays 431, 432.

Configuration of Polarization Split Element

The blue light L1$s$, L2$p$ having passed through the homogenizer optical element 43 enters the polarization split element 44.

The polarization split element 44 is a prism-type polarization beam splitter, and separates an s-polarization component and a p-polarization component included in the incident light from each other. Specifically, the polarization split element 44 reflects the s-polarization component, and transmits the p-polarization component. Further, the polarization split element 44 has a color separation characteristic of transmitting light with the wavelength no shorter than a predetermined wavelength irrespective of whether the light is the s-polarization component or the p-polarization component. Therefore, the blue light L1s as the s-polarized light is reflected by the polarization split element 44, and then enters the first light collection element 45. Meanwhile, the blue light L2p as the p-polarized light is transmitted through the polarization split element 44, and then enters the first retardation element 47.

Configuration of First Light Collection Element

The first light collection element 45 converges the blue light L1s having been reflected by the polarization split element 44 on the wavelength conversion element 46. Further, the first light collection element 45 collimates fluorescence YL entering the first light collection element 45 from the wavelength conversion element 46. Although the first light collection element 45 is constituted by two lenses 451, 452 in the example shown in FIG. 3, the number of lenses constituting the first light collection element 45 does not matter.

Configuration of Wavelength Conversion Element

The wavelength conversion element 46 is excited by the incident light to generate the fluorescence YL longer in wavelength than the incident light, and emits the fluorescence YL to the first light collection element 45. In other words, the wavelength conversion element 46 converts the wavelength of the incident light, and emits the light thus converted. The fluorescence YL generated by the wavelength conversion element 46 is, for example, light with the peak wavelength in a range of 500 through 700 nm. The wavelength conversion element 46 is provided with a wavelength converter 461 and a heat radiator 462.

Although not shown in the drawing, the wavelength converter 461 has a wavelength conversion layer and a reflecting layer. The wavelength conversion layer includes a phosphor for diffusely emitting the fluorescence YL as non-polarized light obtained by performing the wavelength conversion on the blue light L1s entering the phosphor. The reflecting layer reflects the fluorescence YL, which enters the reflecting layer from the wavelength conversion layer, toward the first light collection element 45.

The heat radiator 462 is disposed on a surface at an opposite side to the incident side of light in the wavelength converter 461 to radiate the heat generated in the wavelength converter 461.

The fluorescence YL, which has been emitted from the wavelength conversion element 46, passes through the first light collection element 45 along the illumination light axis Ax2, and then enters the polarization split element 44 having the color separation characteristic described above. Then, the fluorescence YL passes through the polarization split element 44 along the illumination light axis Ax2, and then enters the second retardation element RP.

It should be noted that the wavelength conversion element 46 can also be provided with a configuration of being rotated around a rotational axis parallel to the illumination light axis Ax2 by a rotation device such as a motor.

Configuration of First Retardation Element and Second Light Collection Element

The first retardation element 47 is disposed between the polarization split element 44 and the second light collection element 48. The first retardation element 47 converts the blue light L2p having passed through the polarization split element 44 into blue light L2c as circularly polarized light. The blue light L2c enters the second light collection element 48.

The second light collection element 48 converges the blue light L2c, which enters the second light collection element 48 from the first retardation element 47, on the diffusely reflecting device 49. Further, the second light collection element 48 collimates the blue light L2c entering the second light collection element 48 from the diffusely reflecting device 49. It should be noted that the number of lenses constituting the second light collection element 48 can arbitrarily be changed.

Configuration of Diffusely Reflecting Device

The diffusely reflecting device 49 diffusely reflects the blue light L2c, which has entered the diffusely reflecting device 49, at substantially the same diffusion angle as that of the fluorescence YL generated in and emitted from the wavelength conversion element 46. As a configuration of the diffusely reflecting device 49, there can be illustrated a configuration provided with a reflecting plate for performing Lambertian reflection on the blue light L2c having entered the reflecting plate, and a rotation device for rotating the reflecting plate around a rotational axis parallel to the illumination light axis Ax1.

The blue light L2c having diffusely been reflected by the diffusely reflecting device 49 passes through the second light collection element 48, and then enters the first retardation element 47. The blue light L2c is converted into circularly polarized light with the opposite rotational direction when reflected by the diffusely reflecting device 49. Therefore, the blue light L2c having entered the first retardation element 47 via the second light collection element 48 is not converted into the blue light L2p as the p-polarized light at the moment when having entered the first retardation element 47 from the polarization split element 44, but is converted into the blue light L2s as the s-polarized light. Then, the blue light L2s is reflected by the polarization split element 44 to enter the second retardation element RP. Therefore, the light which enters the second retardation element RP from the polarization split element 44 is white light having the blue light L2s and the fluorescence YL mixed with each other.

Configuration of Second Retardation Element

The second retardation element RP converts the white light, which enters the second retardation element RP from the polarization split element 44, into light having s-polarized light and p-polarized light mixed with each other. The illumination light WL as the white light converted in such a manner enters the homogenizing device 31 described above.

Configuration of Cooling Device

The cooling device 5 cools the cooling target constituting the projector 1. In the present embodiment, the cooling target is the light source 411 of the light source device 4. As shown in FIG. 2, the cooling device 5 is provided with a loop heat pipe 51 and a cooling fan 55.

The cooling fan 55 is disposed between the exhaust port 232 and a condenser 53 described later of the loop heat pipe 51 in the space inside the exterior housing 2. The cooling fan 55 makes cooling air flow through the condenser 53 in the process of suctioning the cooling air inside the exterior housing 2 to discharge the cooling air from the exhaust port 232, and thus, cools the condenser 53. It should be noted that it is also possible to adopt a configuration in which, for example, the cooling fan 55 is disposed between the introduction port 261 and the condenser 53 described later in the space inside the exterior housing 2, suctions the cooling air located outside the exterior housing 2 to feed the cooling air to the condenser 53.

The loop heat pipe 51 has a circulation channel through which the working fluid circulates, wherein the working fluid is encapsulated in a reduced pressure state to thereby be changed in phase state at a relatively low temperature. In the detailed description, the loop heat pipe 51 causes the phase change of the phase state of the working fluid encapsulated inside in the reduced pressure state from the liquid phase to the vapor phase due to the heat transferred from the cooling target to draw the heat from the working fluid in the vapor phase with a region other than regions where the phase change of the working fluid from the liquid phase to the vapor phase has occurred to thereby change the phase state of the working fluid from the vapor phase to the liquid phase, and at the same time, radiates the heat thus drawn to thereby cool the cooling target.

Such a loop heat pipe 51 is provided with the evaporator 6, a vapor pipe 52, the condenser 53, and a liquid pipe 54. It should be noted that a configuration of the evaporator 6 will be described later in detail.

Configuration of Vapor Pipe

The vapor pipe 52 is a tubular member for coupling the evaporator 6 and the condenser 53 to each other in the circulation channel of the working fluid so that the working fluid in the vapor phase can flow. The vapor pipe 52 makes the working fluid in the vapor phase, which has changed to one in the vapor phase in the evaporator 6 and then flows from the evaporator 6 into the vapor pipe 52, flow into the condenser 53.

Configuration of Condenser

The condenser 53 draws the heat of the working fluid in the vapor phase to thereby radiate the heat thereof, and thus, changes the working fluid in phase from the vapor phase to the liquid phase, and then makes the working fluid in the liquid phase flow out to the liquid pipe 54. In other words, the condenser 53 condenses the working fluid in the vapor phase to change the working fluid in the vapor phase to the working fluid in the liquid phase. Although not shown in the drawings, the condenser 53 has a main body part to which the vapor pipe 52 and the liquid pipe 54 are coupled, and a heat radiator coupled to the main body part.

The main body part has a phase change flow channel inside, wherein the working fluid in the vapor phase inflowing from the vapor pipe 52 flows through the phase change flow channel, and the phase change flow channel is communicated with the liquid pipe 54. The heat of the working fluid in the vapor phase is received by the main body part and thus the working fluid is cooled in the process in which the working fluid in the vapor phase flows through the phase change flow channel, and thus, the working fluid in the vapor phase is changed to the working fluid in the liquid phase. Then, the working fluid having been changed in phase to the liquid phase further flows through the phase change flow channel, and cooled by the main body part which receives the heat of the working fluid in the liquid phase, and then flows out to the liquid pipe 54.

The heat radiator is a member for radiating the heat of the working fluid having been transferred to the main body part, and is a so-called heatsink. Through the heat radiator, the cooling gas flows due to the drive of the cooling fan 55, and thus, the condenser 53 is cooled.

Configuration of Liquid Pipe

The liquid pipe 54 is a tubular member for coupling the condenser 53 and the evaporator 6 to each other in the circulation channel of the working fluid so that the working fluid in the liquid phase can flow. The liquid pipe 54 makes the working fluid, which has changed to one in the liquid phase in the condenser 53, flow into the evaporator 6.

Configuration of Evaporator

Figure 4:
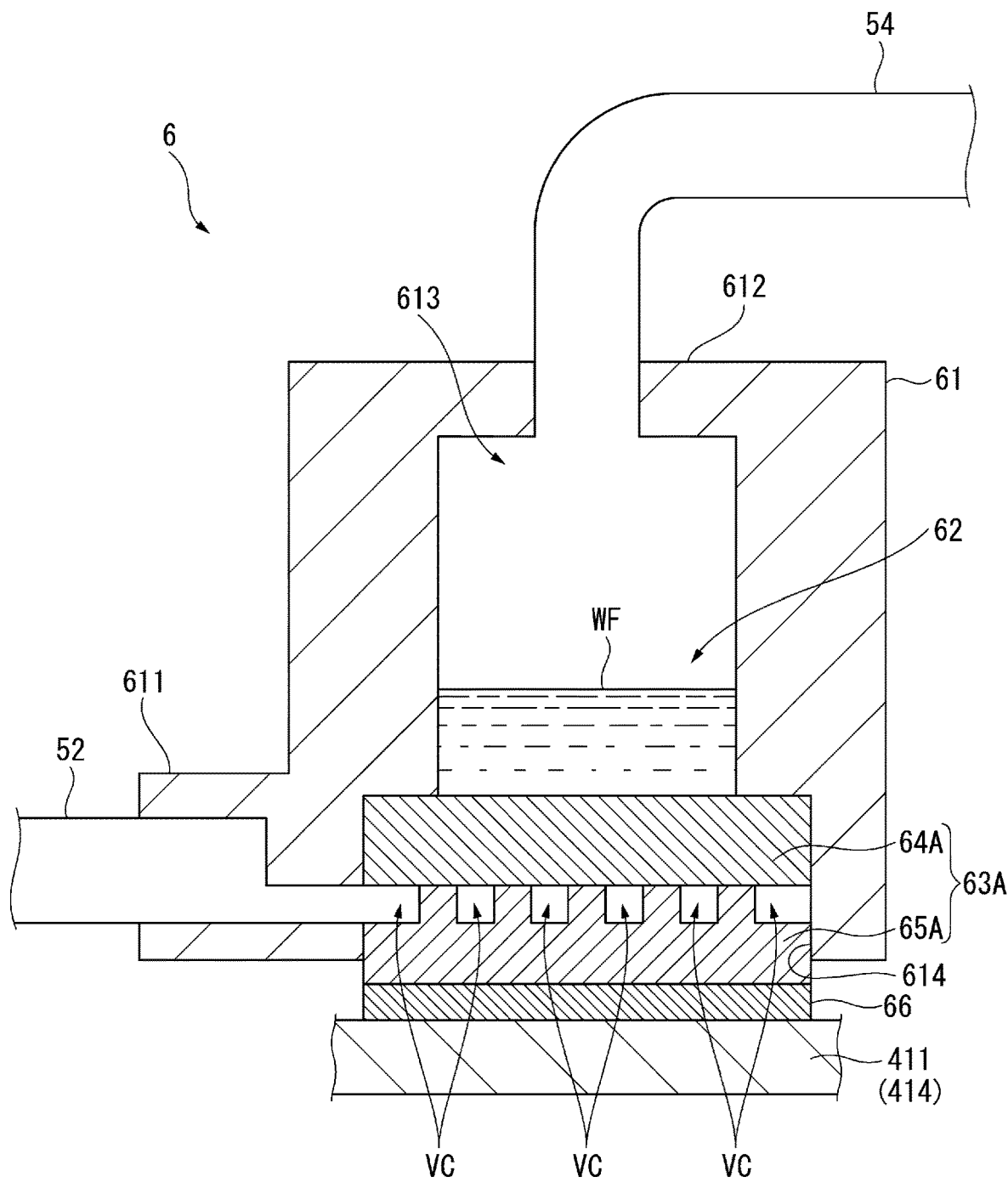
FIG. 4 is a cross-sectional view showing an internal configuration of an evaporator in the first embodiment.

FIG. 4 is a cross-sectional view schematically showing an internal structure of the evaporator 6.

As shown in FIG. 4, the evaporator 6 is an evaporator which is coupled to the light source 411 as the cooling target, and evaporates the working fluid in the liquid phase with the heat transferred from the light source 411 to change the working fluid in the liquid phase to the working fluid in the vapor phase. Specifically, the evaporator 6 is coupled to the support member 414 of the light source 411, and evaporates the working fluid in the liquid phase with the heat of the semiconductor lasers 412, 413 transferred via the support member 414 to thereby cool the semiconductor lasers 412, 413.

As shown in FIG. 4, the evaporator 6 is provided with a housing 61, a reservoir 62, a vapor generator 63A, and a heat receiving member 66. Further, although the details will be described later, the vapor generator 63A located between the reservoir 62 and the heat receiving member 66 is provided with a wick 64A located at the reservoir 62 side, and a groove member 65A located at the heat receiving member 66 side.

Among these constituents, the heat receiving member 66 is coupled to the support member 414 of the light source 411 as the cooling target of the loop heat pipe 51 to transfer the heat generated in the semiconductor lasers 412, 413 to the groove member 65A.

It should be noted that in the following description, a direction from the groove member 65A toward the wick 64A and the reservoir 62 in the evaporator 6 is defined as a +Y direction. The +Y direction corresponds to a first direction. Further, an arrangement direction of a plurality of vapor channels VC provided to the groove member 65A perpendicular to the +Y direction is defined as a +Z direction. The +Z direction corresponds to a second direction. Further, a direction perpendicular to the +Y direction and the +Z direction is defined as a +X direction. Specifically, in the view of the diagram shown in FIG. 4, the +Z direction is defined as a direction from the right toward the left along the direction in which the plurality of vapor flow channels VC described later is arranged. The +X direction is defined as a direction from the front toward the back side along a direction in which the vapor flow channels VC extends.

Further, although not shown in the drawings, an opposite direction to the +X direction is defined as a −X direction, an opposite direction to the +Y direction is defined as a −Y direction, and an opposite direction to the +Z direction is defined as a −Z direction for the sake of convenience of explanation.

The housing 61 is a housing made of metal, and has a vapor pipe coupler 611 to which the vapor pipe 52 is coupled, and a liquid pipe coupler 612 which is located at the opposite side to the vapor pipe coupler 611, and to which the liquid pipe 54 is coupled. Besides the above, the housing 61 has a space 613 formed inside by being combined with the groove member 65A.

The space 613 is formed by the groove member 65A closing a recessed part 614 opening in an end part on the vapor pipe coupler 611 side. The space 613 is communicated with the vapor pipe 52 via the vapor pipe coupler 611, and is communicated with the liquid pipe 54 via the liquid pipe coupler 612. In other words, to the housing 61, there is coupled the liquid pipe 54, and the working fluid in the liquid phase inflows into the space 613 inside the housing 61 from the liquid pipe 54. In the space 613, there is disposed the wick 64A.

The reservoir 62 is disposed inside the housing 61 to retain the working fluid WF in the liquid phase flowing into the space 613 via the liquid pipe 54. In other words, the reservoir 62 is a region in which the working fluid WF in the liquid phase having failed to be suctioned by the wick 64A is stored in the space 613 inside the housing 61.

The vapor generator 63A changes the working fluid WF having been suctioned from the reservoir 62 to the working fluid in the vapor phase with the heat transferred from the light source 411 as the cooling target, and then makes the vapor as the working fluid in the vapor phase flow through the vapor pipe 52. The vapor generator 63A has the wick 64A and the groove member 65A as described above.

The wick 64A is a porous body shaped like a flat plate soaked with the working fluid WF in the liquid phase, and is disposed inside the housing 61 so as to have contact with the working fluid WF in the liquid phase retained in the reservoir 62. Then, the wick 64A transports the working fluid WF in the liquid phase retained in the reservoir 62 toward the groove member 65A, namely in the −Y direction due to a capillary force. The wick 64A is formed of a metal fiber made of, for example, copper or stainless steel, or a material such as glass.

The groove member 65A is provided to the housing 61, and is coupled to the wick 64A. The groove member 65A evaporates the working fluid WF in the liquid phase having been transported by the wick 64A with the heat transferred from the light source 411 as the cooling target via the heat receiving member 66. As described above, since the heat drawn from the light source 411 is used for the phase change of the working fluid WF from the liquid phase to the vapor phase, the heat transfer is promoted and the light source 411 is cooled.

The groove member 65A has a plurality of vapor flow channels VC through which the working fluid having changed from the liquid phase to the vapor phase flows. Further, the plurality of vapor flow channels VC is communicated with the vapor pipe 52, and the working fluid having changed from the liquid phase to the vapor phase flows out to the vapor pipe 52 through the plurality of vapor flow channels VC.

Figure 5:
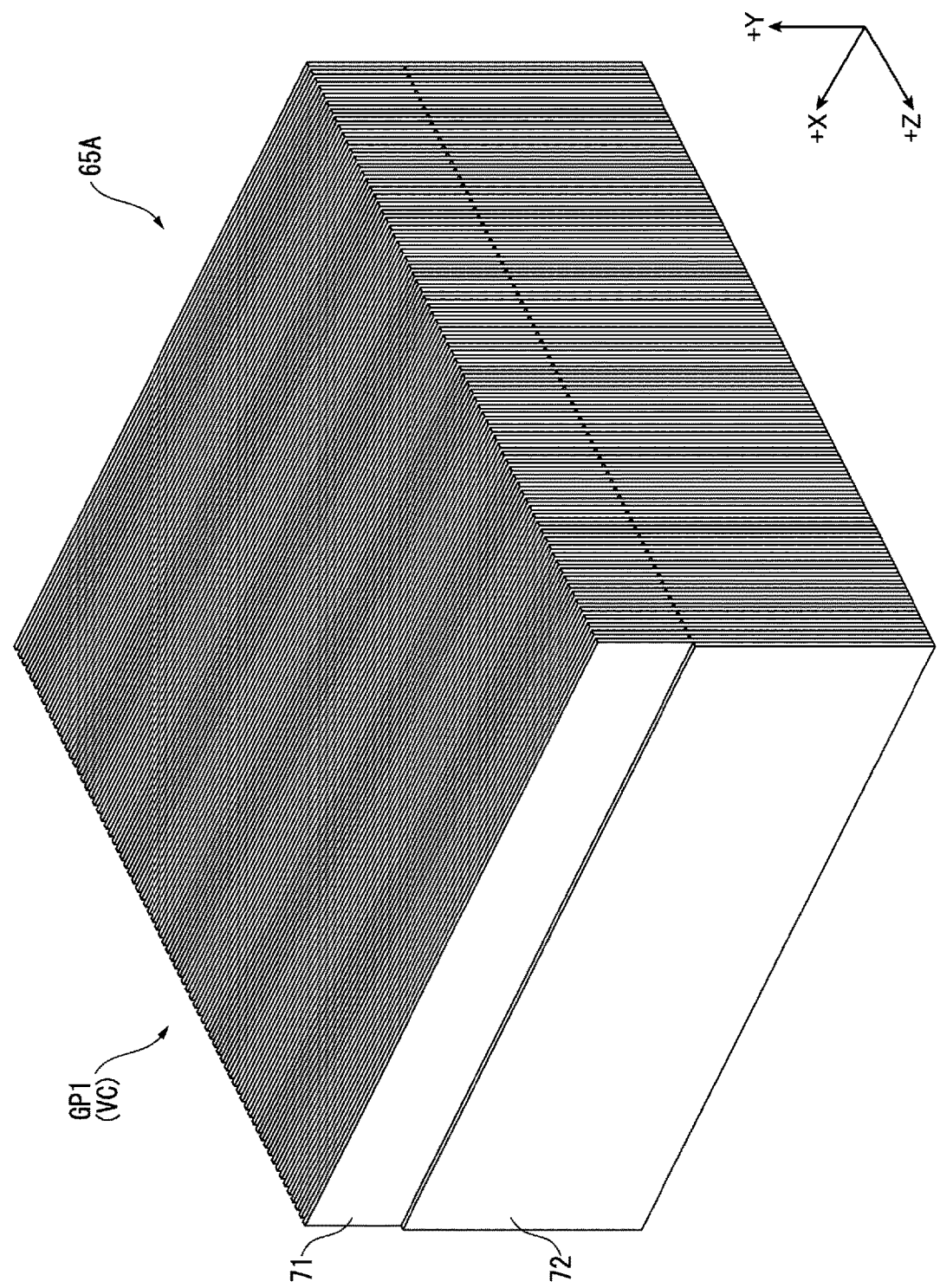
FIG. 5 is a perspective view showing a groove member in the first embodiment.
Figure 6:
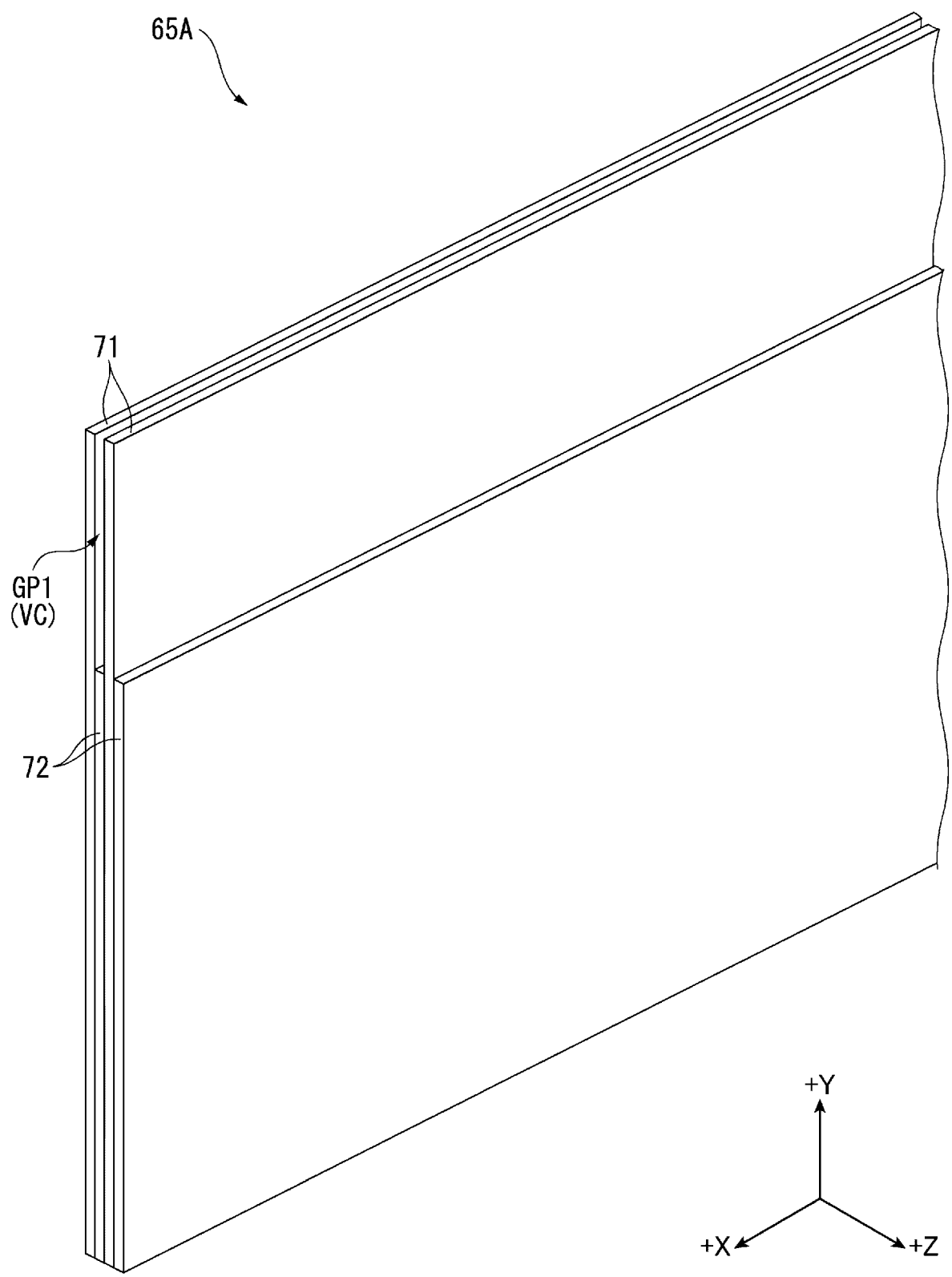
FIG. 6 is a perspective view showing a part of the groove member in the first embodiment in an enlarged manner.

FIG. 5 is a perspective view showing the groove member 65A, and FIG. 6 is a perspective view showing a part of the groove member 65A in an enlarged manner. It should be noted that in FIG. 5, first metal plates 71, second metal plates 72, and gaps GP1 constituting the groove member 65A are only partially denoted by reference symbols taking the eye-friendliness into consideration.

As shown in FIG. 5 and FIG. 6, the groove member 65A is provided with the plurality of first metal plates 71 and the plurality of second metal plates 72, and is configured by alternately stacking the first metal plates 71 and the second metal plates 72 on one another along the +Z direction. In other words, the +Z direction (the second direction) is a direction in which the first metal plates 71 and the second metal plates 72 constituting the groove member 65A are stacked on one another. The first metal plates 71 and the second metal plates 72 are each a thin plate made of metal, and are bonded to each other with diffusion bonding or the like.

The dimension in the +X direction in the first metal plates 71 is substantially the same as the dimension in the +X direction in the second metal plates 72. In other words, the width dimension of the first metal plates 71 and the width dimension of the second metal plates 72 are substantially the same. Further, the dimension in the +Z direction in the first metal plates 71 is substantially the same as the dimension in the +Z direction in the second metal plates 72. In other words, the thickness dimension of the first metal plates 71 and the thickness dimension of the second metal plates 72 are substantially the same.

In contrast, the dimension in the +Y direction in the first metal plates 71 is larger than the dimension in the +Y direction in the second metal plates 72. In other words, the height dimension of the first metal plates 71 is larger than the height dimension of the second metal plates 72.

The first metal plates 71 and the second metal plates 72 are bonded to each other so that the end parts in the ±X directions coincide with each other, and the end parts in the −Y direction coincide with each other. Therefore, the end part in the +Y direction in each of the first metal plates 71 is located at the +Y direction side of the end part in the +Y direction in each of the second metal plates 72. In other words, the end part in the +Y direction in each of the second metal plates 72 is located at the −Y direction side of the end part in the +Y direction in each of the first metal plates 71.

Figure 7:
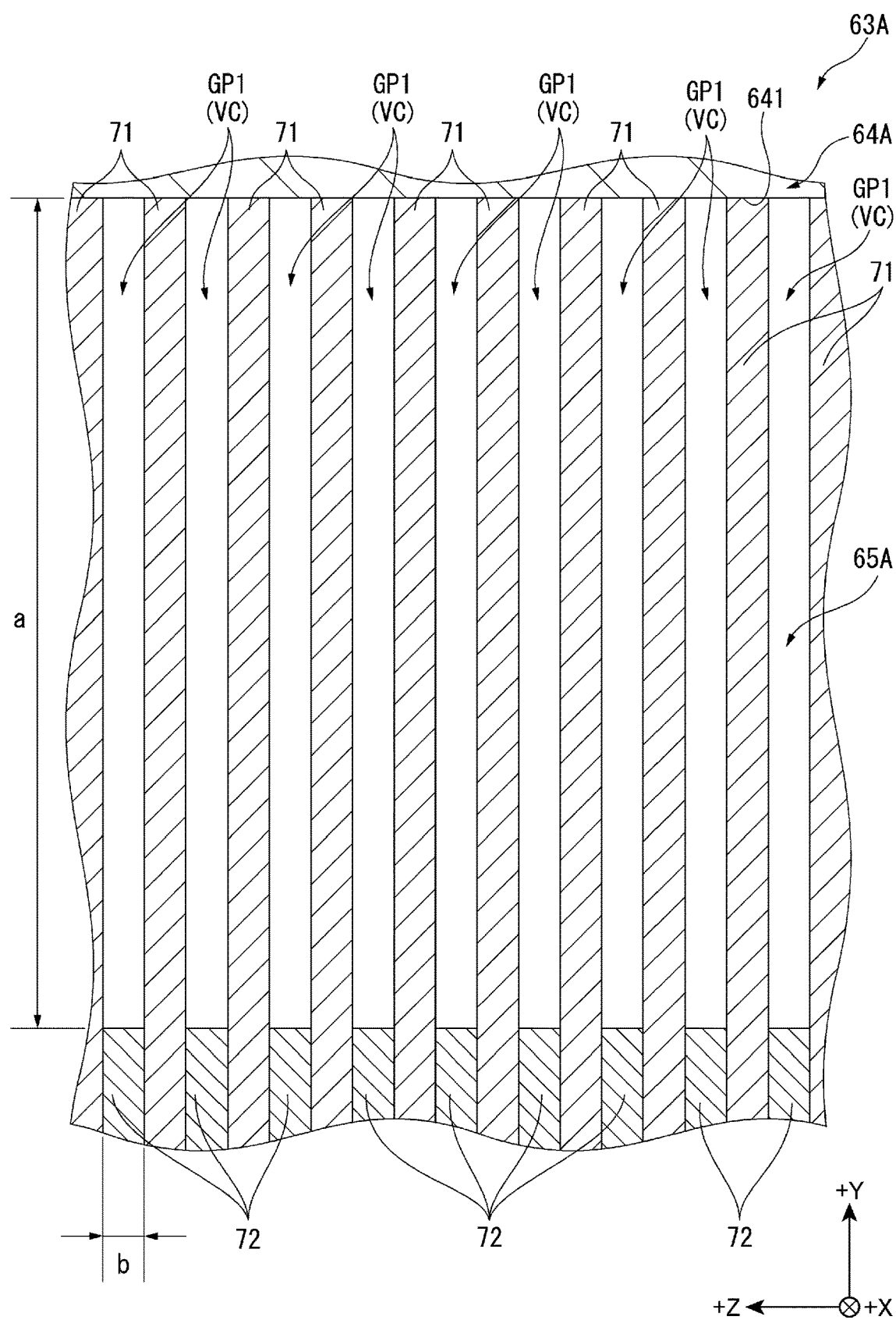
FIG. 7 is a cross-sectional view showing the groove member in the first embodiment.

FIG. 7 is a cross-sectional view showing the groove member 65A. In the detailed description, FIG. 7 is a diagram showing a cross-section of the groove member 65A along the Y-Z plane.

As shown in FIG. 7, the first metal plates 71 are coupled to the wick 64A. In the present embodiment, the end part of each of the first metal plates 71 has contact with the wick 64A. Further, the second metal plates 72 are disposed at a larger distance from the wick 64A than that of the first metal plates 71. In the groove member 65A constituted by the first metal plates 71 and the second metal plates 72 combined with each other in such a manner, in a region at the +Y direction side of the second metal plate 72 between the pair of first metal plates 71 sandwiching the second metal plate 72, there is formed the gap GP1 extending along the +X direction as shown in FIG. 6 and FIG. 7. As shown in FIG. 7, the gap GP1 forms the vapor flow channel VC through which the vapor generated in the wick 64A or the groove member 65A flows along the +X direction when the end part in the +Y direction in each of the first metal plates 71 is disposed so as to have contact with an end surface 641 at the −Y direction side in the wick 64A. In other words, each of the vapor flow channels VC is formed between one of the first metal plates 71 and another of the first metal plates 71 adjacent to the one of the first metal plates 71 at the wick 64A side of the groove member 65A.

It should be noted that the area of the cross-sectional surface along the Y-Z plane of the gap GP1, namely the area of the cross-sectional surface perpendicular to the flowing direction of the vapor in the vapor flow channel VC, can be set by adjusting the dimension in the +Y direction and the dimension in the +Z direction in the second metal plate 72.

As shown in FIG. 5 and FIG. 6, the end parts in the −Y direction in the first metal plates 71 and the end parts in the −Y direction in the second metal plates 72 substantially coincide with each other. According to this configuration, a value obtained by subtracting the dimension in the +Y direction in the second metal plate 72 from the dimension in the +Y direction in the first metal plate 71 becomes a dimension a in the +Y direction in the gap GP1.

Further, a dimension b in the +Z direction in the gap GP1 coincides with the dimension in the +Z direction in the second metal plate 72, namely the thickness dimension of the second metal plate 72.

In the present embodiment, the dimension a in the +Y direction in the gap GP1 is larger than the dimension b in the +Z direction in the gap GP1. In other words, in the cross-sectional surface of each of the vapor flow channels VC when viewing the groove member 65A along the +X direction perpendicular to the +Y direction (the first direction)

and the +Z direction (the second direction), the dimension a along the +Y direction is larger than the dimension b along the +Z direction.

Since it is possible to adjust the ratio (the aspect ratio) of the dimension b in the +Z direction to the dimension a in the +Y direction of the gap GP1 having a rectangular shape by adjusting the dimension in the +Y direction and the dimension in the +Z direction in the second metal plate 72, it is possible to adjust the area of the cross-sectional surface along the Y-Z plane of the gap GP1, and by extension, the cross-sectional area perpendicular to the direction in which the vapor flows in each of the vapor flow channels VC. Thus, by increasing the aspect ratio, it is possible to increase the flow channel cross-sectional area of the vapor flow channels VC, and by extension, it is possible to decrease the pressure loss caused when discharging the vapor.

In contrast, by increasing the aspect ratio, it is possible to decrease the arrangement pitch of the first metal plates 71. Thus, since it is possible to increase the number of the end parts per unit area in the +Y direction in the first metal plates 71, namely the number of vapor generating regions per unit area, in the whole of the groove member 65A, wherein the vapor generating regions have contact with the wick 64A to generate the vapor, it is possible to increase the generation amount of the vapor.

Therefore, by increasing the generation amount of the vapor by the evaporator 6 and reducing the pressure loss when discharging the vapor, it is possible to advance the heat reception from the light source 411 as the cooling target, and it is possible to increase the cooling efficiency of the light source 411.

It should be noted that in the present embodiment, the ratio of the dimension b in the +Z direction to the dimension a in the +Y direction in the cross-sectional surface of the vapor flow channel VC along the Y-Z plane, namely the aspect ratio (the value of "(the vertical dimension)/(the horizontal dimension)" of the gap GP1, is set to about 19. However, this is not a limitation, and the vapor thus generated can be discharged in good condition providing the aspect ratio is no smaller than, for example, 2.

It should be noted that in the present embodiment, the thermal conductivity of the first metal plates 71 to be coupled to the wick 64A is higher than the thermal conductivity of the second metal plates 72. Therefore, it is possible to make it easy to transfer the heat, which has been transferred from the light source 411 to the first metal plates 71 via the heat receiving member 66, to the wick 64A for transporting the working fluid WF in the liquid phase. Thus, it is possible to promote the phase change of the working fluid from the liquid phase to the vapor phase in the wick 64A or the first metal plates 71.

Besides the above, when forming the second metal plates 72 from the metal light in weight, it is possible to make the groove member 65A light in weight, and further, when forming the second metal plates 72 from the metal low in price, it is possible to reduce the manufacturing cost of the groove member 65A.

However, this is not a limitation, but it is also possible for the material of the first metal plates 71 and the material of the second metal plates 72 to be the same as each other.

Advantages of First Embodiment

The projector 1 according to the present embodiment described hereinabove has the following advantages.

The projector 1 is provided with the light source 4, the light modulation devices 343 (343B, 343G, and 343R), the projection optical device 36 and the cooling device 5 described above, wherein the light source device 4 has the light source 411 for emitting the light, the light modulation devices 343 each modulate the light emitted from the light source device 4, and the projection optical device 36 projects the light modulated by the light modulation devices 343. The cooling target of the cooling device 5 is the light source 411.

Further, the cooling device 5 is provided with the loop heat pipe 51. The loop heat pipe 51 is provided with the evaporator 6, the condenser 53, the vapor pipe 52, and the liquid pipe 54, wherein the evaporator 6 evaporates the working fluid in the liquid phase with the heat transferred from the light source 411 as the cooling target to thereby change the phase of the working fluid to the vapor phase, the condenser 53 condenses the working fluid in the vapor phase to thereby change the phase of the working fluid to the liquid phase, the vapor pipe 52 makes the working fluid having changed in the evaporator 6 to one in the vapor phase flow into the condenser 53, and the liquid pipe 54 makes the working fluid having changed in the condenser 53 to one in the liquid phase flow into the evaporator 6. The evaporator 6 has the housing 61, the wick 64A, the reservoir 62, and the groove member 65A, wherein the housing 61 is coupled to the liquid pipe 54, the working fluid in the liquid phase flows into the housing 61, the wick 64A is disposed inside the housing 61, soaked with the working fluid in the liquid phase, and transports the working fluid in the liquid phase, the reservoir 62 is disposed inside the housing 61, and retains the working fluid in the liquid phase having flowed into the housing 61, and the groove member 65A has the plurality of vapor flow channels VC through which the working fluid having changed in phase from the liquid phase to the vapor phase flows, and is coupled to the wick 64A. The groove member 65A is configured by alternately stacking the first metal plates 71 and the second metal plates 72 along the +Z direction as the second direction perpendicular to the +Y direction as the first direction from the groove member 65A toward the reservoir 62, wherein the first metal plates 71 are coupled to the wick 64A, and the second metal plates 72 are disposed at a larger distance from the wick 64A than that of the first metal plates 71. The vapor flow channels VC are each formed between one of the first metal plates 71 and another of the first metal plates 71 adjacent to the one of the first metal plates 71 at the wick 64A side of the groove member 65A. Further, in the cross-sectional surface of each of the vapor flow channels VC when viewing the groove member 65A along the +X direction perpendicular to the +Y direction and the +Z direction, the dimension a along the +Y direction is larger than the dimension b along the +Z direction.

According to such a configuration, by adjusting the dimension along the +Y direction and the dimension along the +Z direction in the second metal plates 72, namely the height dimension and the thickness dimension of the second metal plates 72, it is possible to increase the aspect ratio (the ratio of (the vertical dimension)/(the horizontal dimension)) in the flow channel cross-sectional area of each of the vapor flow channels VC. Thus, it is possible to increase the flow channel cross-sectional area of each of the vapor flow channels VC, and at the same time, decrease the arrangement pitch of the first metal plates 71 having contact with the wick 64A. Therefore, it is possible to reduce the pressure loss when discharging the working fluid in the vapor phase flowing through the vapor flow channels VC, and at the same time, increase the number of the phase change regions (the vapor generating regions) per unit area in the groove member 65A, wherein the phase of the working fluid changes from the liquid phase to the vapor phase in the phase change regions. Therefore, since it is possible to promptly discharge the working fluid having changed in phase from the liquid phase to the vapor phase to thereby advance the phase change of the working fluid from the liquid phase to the vapor phase, it is possible to increase the cooling efficiency of the light source 411 as the cooling target.

The thermal conductivity of the first metal plates 71 is higher than the thermal conductivity of the second metal plates 72.

According to this configuration, it is possible to make it easy to transfer the heat, which has been transferred from the light source 411 to the first metal plates 71 via the heat receiving member 66, to the wick 64A for transporting the working fluid WF in the liquid phase. Thus, it is possible to promote the phase change of the working fluid from the liquid phase to the vapor phase in the wick 64A or the first metal plates 71.

Second Embodiment

Then, a second embodiment of the present disclosure will be described.

A projector according to the present embodiment has substantially the same configuration as the projector 1 described in the first embodiment, but is different from the projector 1 in the point that there is provided a vapor generator having the wick and the groove member integrated with each other. It should be noted that in the following description, apart which is the same or substantially the same as the part having already been described is denoted by the same reference symbol, and the description thereof will be omitted.

Figure 8:
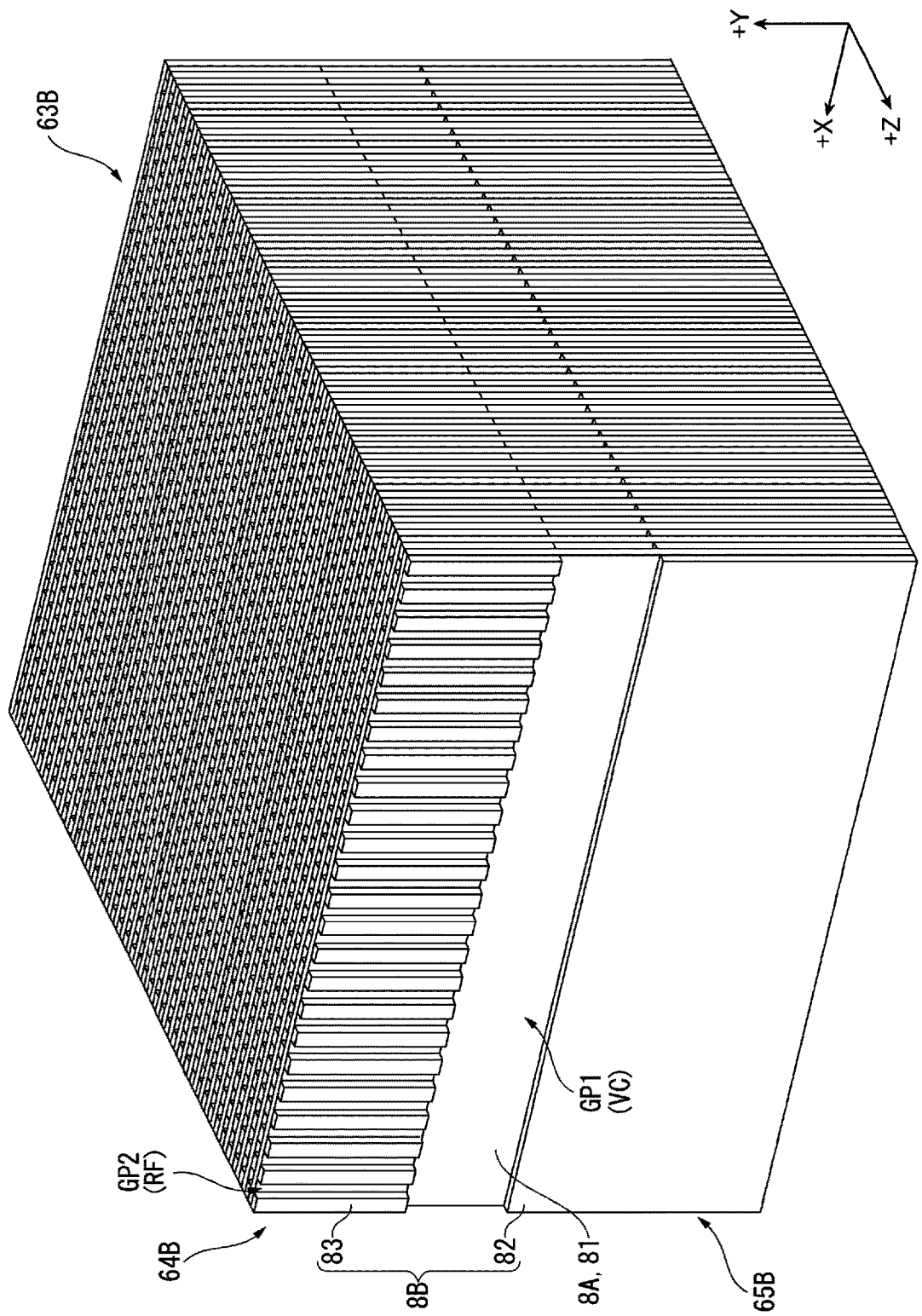
FIG. 8 is a perspective view showing a vapor generator provided to a projector according to a second embodiment.

FIG. 8 is a perspective view showing the vapor generator 63B provided to the projector according to the present embodiment.

The projector according to the present embodiment has substantially the same configuration and functions as those of the projector 1 except the point that the projector according to the present embodiment is provided with the vapor generator 63B instead of the vapor generator 63A. In other words, the evaporator 6 of the cooling device according to the present embodiment is provided with the housing 61, the reservoir 62, and the heat receiving member 66, and the vapor generator 63B shown in FIG. 8.

The vapor generator 63B has the wick 64B and the groove member 65B similarly to the vapor generator 63A, but in the vapor generator 63B in the present embodiment, the wick 64B and the groove member 65B are integrated with each other. Specifically, the vapor generator 63B has a plurality of first metal plates 81, a plurality of second metal plates 82, and a plurality of third metal plates 83, and the wick 64B and the groove member 65B are integrally configured by the metal plates 81 through 83.

Figure 9:
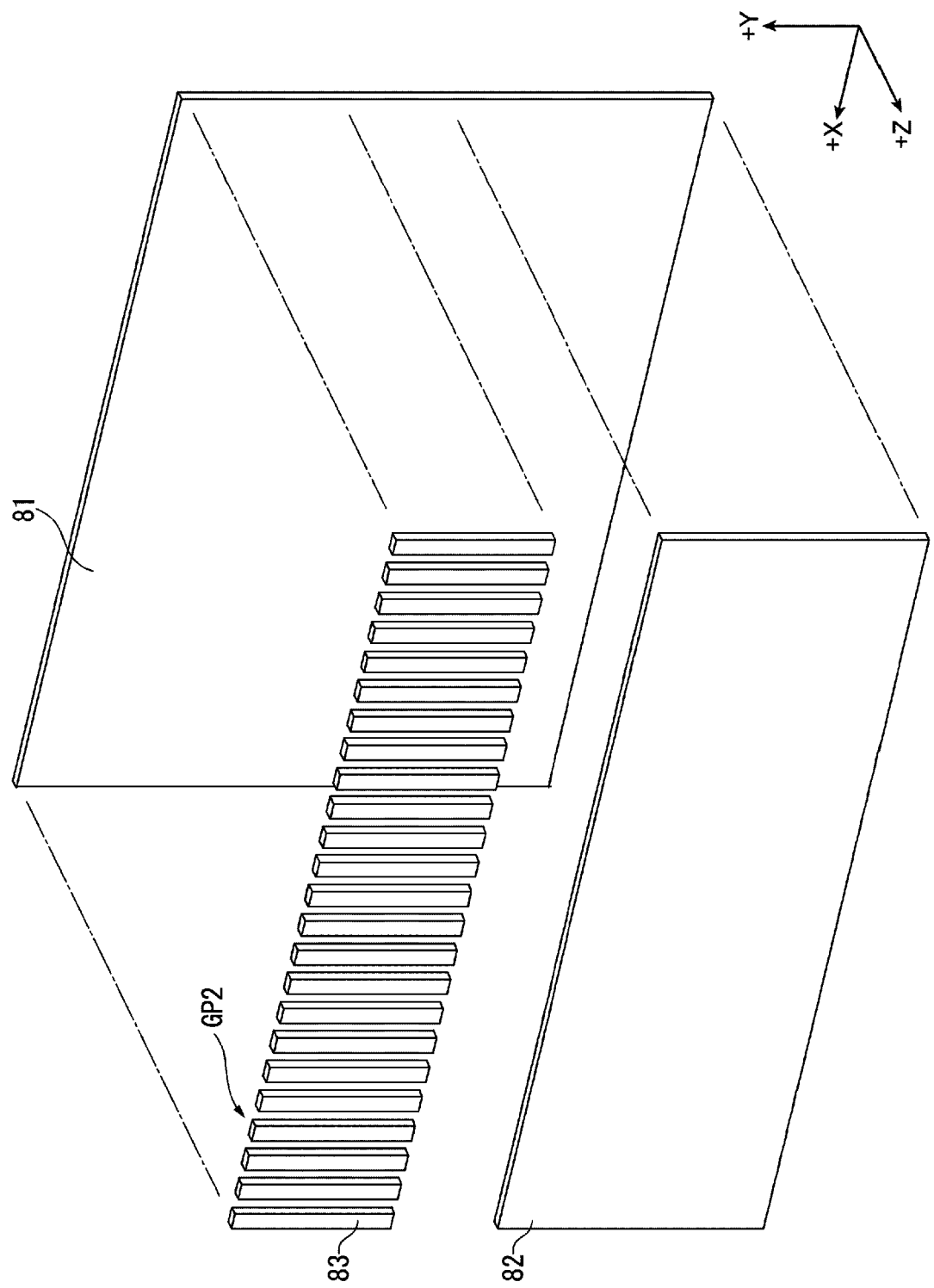
FIG. 9 is a diagram showing arrangement positions of first through third metal plates in the second embodiment.

FIG. 9 is a diagram for explaining the arrangement positions of the first metal plates 81, the second metal plates 82 and the third metal plates 83. It should be noted that in FIG. 9, one of the third metal plates 83 is denoted alone by a reference symbol taking the eye-friendliness into consideration.

The first metal plates 81, the second metal plates 82, and the third metal plates 83 are each formed of a thin plate made of metal similarly to the first metal plates 71, the second metal plates 72 in the first embodiment. Specifically, the first metal plates 81 and the second metal plates 82 are each a metal plate as a flat plate disposed along an X-Y plane, and the third metal plates 83 are metal plates as flat plates each extending in the +Y direction and separated by a gap GP2 arranged along the +X direction.

The first metal plates 81, the second metal plates 82, and the third metal plates 83 are the same in dimension in the +Z direction as each other. In other words, the first metal plates 81, the second metal plates 82, and the third metal plates 83 are substantially the same in thickness dimension as each other. Further, the first metal plates 81 and the second metal plates 82 are the same in dimension in the +X direction as each other. In other words, the first metal plates 81 and the second metal plates 82 are the same in width dimension as each other. Further, as shown in FIG. 9, the dimension in the +X direction of one of the third metal plates 83 is sufficiently smaller than the dimension in the +X direction of the first metal plates 81 and the dimension in the +X direction of the second metal plates 82.

In contrast, the dimension in the +Y direction in the first metal plates 81 is larger than the dimension in the +Y direction in the second metal plates 82, and the dimension in the +Y direction in the third metal plates 83. In other words, the height dimension of the first metal plates 81 is larger than the height dimension of the second metal plates 82, and the height dimension of the third metal plates 83.

The second metal plates 82 are arranged in accordance with the regions at the −Y direction side in the first metal plates 81. In the detailed description, the first metal plates 81 and the second metal plates 82 are alternately stacked on one another along the +Z direction so that two end parts in the ±X directions in each of the first metal plates 81 and two end parts in the ±X directions in each of the second metal plates 82 substantially coincide with each other, respectively, and an end part in the −Y direction in each of the first metal plates 81 and an end part in the −Y direction in each of the second metal plates 82 substantially coincide with each other.

The plurality of third metal plates 83 is arranged in accordance with the regions at the +Y direction side in one of the first metal plates 81. In other words, as shown in FIG. 8 and FIG. 9, the plurality of third metal plates 83 is arranged at the +Y direction side with respect to one of the second metal plates 82. In the detailed description, the one of the first metal plates 81 and the plurality of third metal plates 83 arranged along the +X direction in accordance with the one of the first metal plates 81 are arranged so that the end part in the +X direction in the one of the first metal plates 81 and the end part of the third metal plate 83 disposed at the endmost side in the +X direction out of the plurality of third metal plates 83 substantially coincide with each other, and the end part in the −X direction in the one of the first metal plates 81 and the end part of the third metal plate 83 disposed at the endmost side in the −X direction out of the plurality of third metal plates 83 substantially coincide with each other, and a plurality of sets of the one of the first metal plates 81 and the plurality of third metal plates is stacked on one another along the +Z direction. Further, the plurality of sets of the one of the first metal plates 81 and the plurality of the third metal plates 83 is stacked on one another along the +Z direction so that the end part in the +Y direction in the first metal plate 81 and the end parts in the +Y direction in the plurality of third metal plates 83 substantially coincide with each other.

It should be noted that the thermal conductivity of the first metal plates 81 is higher than the thermal conductivity of the second metal plates 82 and the thermal conductivity of the third metal plates 83.

As described above, by the first metal plates 81 and the second metal plates 82 being alternately stacked on one another along the +Z direction, and the first metal plates 81 and the plurality of third metal plates 83 being alternately stacked on one another along the +Z direction, the vapor generator 63B is configured.

It should be noted that the wick 64B is constituted by the plurality of third metal plates 83 and the regions overlapping the plurality of third metal plates 83 in the first metal plates 81. In other words, the wick 64B is constituted by the plurality of sets of the first metal plate 81 and the plurality of third metal plates 83 arranged at the +Y direction side with respect to the second metal plate 82 stacked on one another along the +Z direction.

Further, the groove member 65B is constituted by the second metal plates 82 and the regions in the first metal plates 81 overlapping the second metal plates 82, and the gaps GP1 and the regions in the first metal plates 81 overlapping the gaps GP1. In other words, the groove member 65B is a region at the −Y direction side with respect to the wick 64B in the vapor generator 63B.

Figure 10:
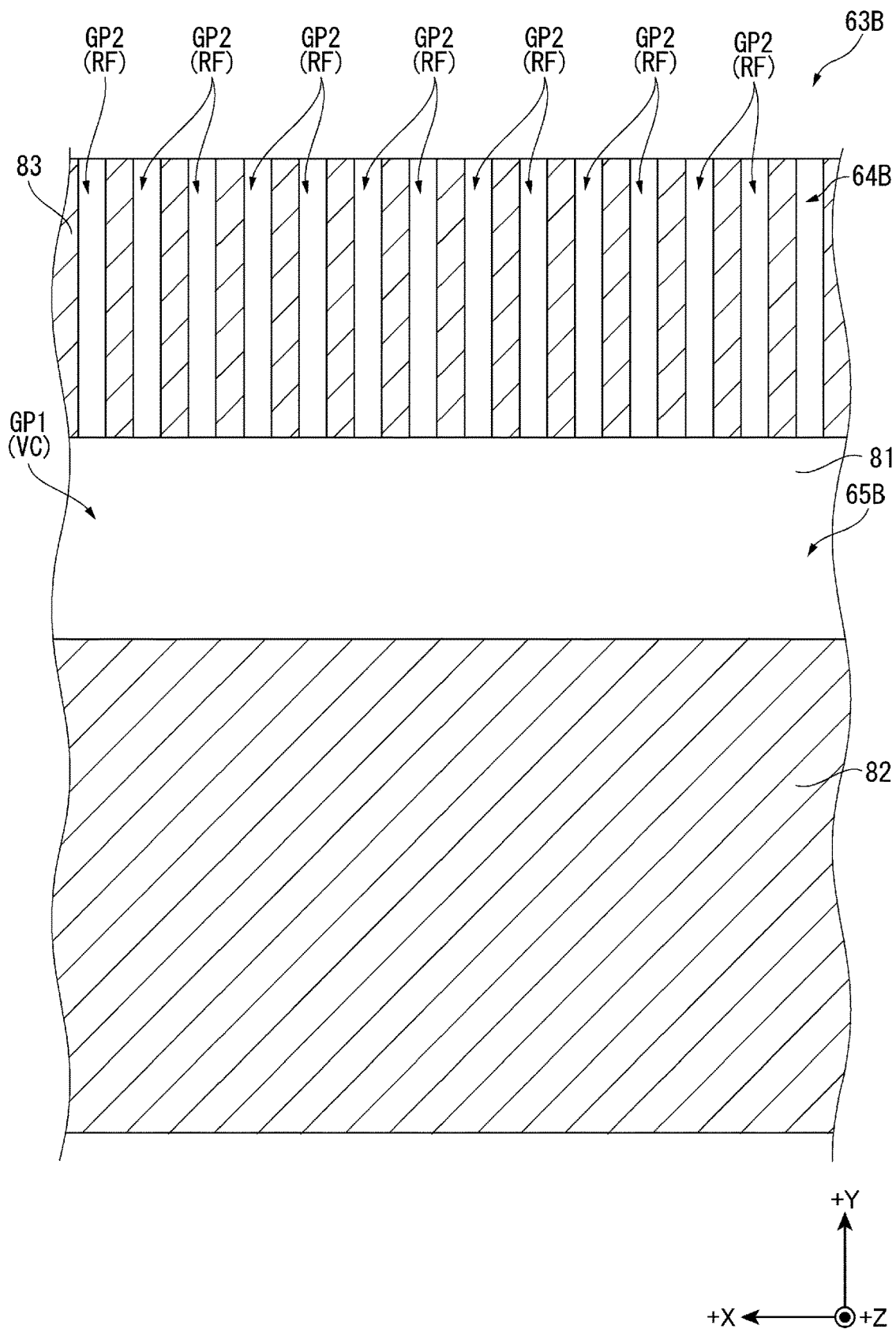
FIG. 10 is a cross-sectional view showing the vapor generator in the second embodiment.

FIG. 10 is a diagram showing a cross-sectional surface of the vapor generator 63B along the X-Y plane at the arrangement position of the second metal plate 82 and the third metal plates 83.

As shown in FIG. 10, between one of the third metal plates 83 and another of the third metal plates 83 adjacent to the one of the third metal plates 83, there is disposed the gap GP2 for communicating a space at the +Y direction side with respect to the plurality of third metal plates 83 and a space at the −Y direction side with respect to the plurality of third metal plates 83 with each other along the +Y direction. In other words, between the third metal plates 83 arranged along the +X direction, there are disposed the gap GP2. In other words, between the first metal plates 81 adjacent to each other, the plurality of gaps GP2 is disposed due to the plurality of third metal plates 83. The plurality of gaps GP2 forms a plurality of transport flow channels RF which communicates the gap GP1 constituting the vapor flow channel VC and the reservoir 62 with each other in the vapor generator 63B to transport the working fluid in the liquid phase retained in the reservoir 62 in the −Y direction due to the capillary force. Since the gaps GP2 are arranged in the +X direction, it results in that the vapor generator 63B has a plurality of transport flow channels RF. In other words, the plurality of third metal plates 83 is combined with the first metal plate 81 to thereby form the plurality of transport flow channels RF.

The plurality of third metal plates 83 and the second metal plate 82 are arranged at a distance in the +Y direction. In other words, the second metal plate 82 is located at the −Y direction side at a predetermined distance with respect to the plurality of third metal plates 83 so that the gap GP1 described above is formed between the second metal plate 82 and the plurality of third metal plates 83.

In the present embodiment, the dimension in the +Y direction in the gap GP1 has a value obtained by subtracting the dimension in the +Y direction in the second metal plate 82 and the dimension in the +Y direction in the third metal plates 83 from the dimension in the +Y direction in the first metal plate 81. In other words, the dimension in the +Y direction in the gap GP1 is set by the separation amount between the second metal plate 82 and the plurality of third metal plates 83 in the +Y direction. As described above, the dimension in the +Y direction in the gap GP1 is adjusted by adjusting the dimensions in the +Y direction of the first metal plate 81, the second metal plate 82, and the third metal plates 83.

Further, the dimension in the +Z direction in the gap GP1 is defined by larger one of the dimension in the +Z direction in the second metal plate 82 and the dimension in the +Z direction in the third metal plates 83. It should be noted that in the present embodiment, the dimension in the +Z direction in the second metal plate 82 and the dimension in the +Z direction in the third metal plates 83 are substantially the same. This derives from the fact that the second metal plate 82 and the third metal plates 83 are formed from the same second substrate 8B (see FIG. 11).

Further, in the present embodiment, the dimension in the +Y direction in the gap GP1 is larger than the dimension in the +Z direction in the second metal plate 82 and the dimension in the +Z direction in the third metal plates 83. Therefore, in the area of the cross-sectional surface along the Y-Z plane of the vapor flow channel VC formed of the gap GP1, namely the area of the cross-sectional surface perpendicular to the flowing direction of the vapor flowing through the vapor flow channel VC, the dimension in the +Y direction is larger than the dimension in the +Z direction.

Manufacturing Process of Vapor Generator

FIG. 11 is a diagram for explaining a process in a manufacturing process of the vapor generator 63B. It should be noted that in FIG. 11, one of gaps 8B3 disposed between a plurality of projecting parts 8B2 is denoted alone by a reference symbol taking the eye-friendliness into consideration.

Hereinafter, an example of the manufacturing process of the vapor generator 63B will be described.

As described above, the vapor generator 63B is configured by bonding the second metal plate 82 and the third metal plates 83 to the first metal plate 81 with the diffusion bonding or the like, and stacking the plurality of metal plates 81 through 83 on one another. The second metal plate 82 and the third metal plates 83 are formed by cutting the second substrate 8B to be stacked on a first substrate 8A forming the first metal plate 81 as shown in FIG. 11. It should be noted that the first substrate 8A is a thin plate made of metal although the detailed illustration will be omitted.

The second substrate 8B is a thin plate made of metal.

The second substrate 8B has an opening part 8B1 at the center thereof, the opening part 8B1 having a rectangular shape in which a dimension in the +X direction is longer than a dimension in the +Y direction. Besides the above, the second substrate 8B has the plurality of projecting parts 8B2 having a comb-like shape projecting in the −Y direction, the plurality of projecting parts 8B2 being located at the +Y direction side with respect to the opening part 8B1. In other words, the projecting parts 8B2 arranged along the +X direction project in the −Y direction from the end part in the +Y direction in the second substrate 8B toward the opening part 8B1. In other words, the projecting parts 8B2 are coupled to each other in the regions at the +Y direction side, and the gaps 8B3 formed between the projecting parts 8B2 are communicated with the opening part 8B1.

The vapor generator 63B is manufactured by cutting a manufacturing intermediate body PR, which is obtained by alternately stacking and then bonding a plurality of first substrates 8A and a plurality of second substrates 8B with each other along the +Z direction, along the cutting lines LA, LB, and LC represented by the dotted lines in FIG. 11.

The cutting lines LA, LB are cutting lines set along the +Y direction at positions at the +X direction side and the −X direction side with respect to the plurality of projecting parts 8B2. Further, the cutting line LC is a cutting line for cutting each of the projecting parts 8B2 along the +X direction.

By cutting the manufacturing intermediate body PR on the cutting lines LA, LB, and LC as described above, the gap GP1 is formed by the opening part 8B1, and further, the gaps GP2 are formed by the gaps 8B3 between the projecting parts 8B2. Further, as described above, in the vapor generator 63B thus manufactured, the vapor flow channel VC is formed by each of the gaps GP1, and the transport flow channel RF is formed by each of the gaps GP2.

Advantages of Second Embodiment

According to the projector related to the present embodiment described hereinabove, in addition to the advantages substantially the same as those of the projector 1 described in the first embodiment, the following advantages can be exerted.

The vapor generator 63B constituted by the first metal plates 81, the second metal plates 82, and the third metal plates 83 has a configuration in which the wick 64B and the groove member 65B are integrated with each other.

According to the above, it is possible to obtain the configuration in which the groove member 65B is directly coupled to the wick 64B, and it is possible to make it easy to transfer the heat of the light source 411 to be transferred via the heat receiving member 66 to the region through which the working fluid in the liquid phase flows. Therefore, since it is possible to advance the phase change of the working fluid from the liquid phase to the vapor phase, it is possible to increase the cooling efficiency of the light source 411 as the cooling target.

Further, by the wick 64B and the groove member 65B being integrated with each other, it is possible to simplify the configuration of the evaporator 6.

The wick 64B is constituted by the plurality of sets of the first metal plate 81 and the plurality of third metal plates 83 arranged at the +Y direction side as the first direction side with respect to the second metal plate 82 stacked on one another along the +Z direction as the second direction. The third metal plates 83 are combined with the first metal plate 81 to thereby form the transport flow channels RF for transporting the working fluid WF in the liquid phase retained in the reservoir 62 in the −Y direction as an opposite direction to the first direction.

According to this configuration, it is possible to transport the working fluid WF in the liquid phase retained in the reservoir 62 toward the groove member 65B using the capillary force by the transport flow channels RF formed between the first metal plates 81, and in addition, it is possible to simplify the configuration of the wick 64B to be integrated with the groove member 65B. Therefore, it is possible to simplify the configuration of the evaporator 6, and by extension, the cooling device 5.

Third Embodiment

Then, a third embodiment of the present disclosure will be described.

A projector according to the preset embodiment has substantially the same configuration as that of the projector described in the second embodiment, but is different from the projector described in the second embodiment in the point that the vapor generator is constituted by a larger number of types of metal plates in addition to the fact that the shape of the transport flow channel of the vapor generator in which the wick and the groove member are integrated with each other is different. It should be noted that in the following description, a part which is the same or substantially the same as the part having already been described is denoted by the same reference symbol, and the description thereof will be omitted.

Figure 12:
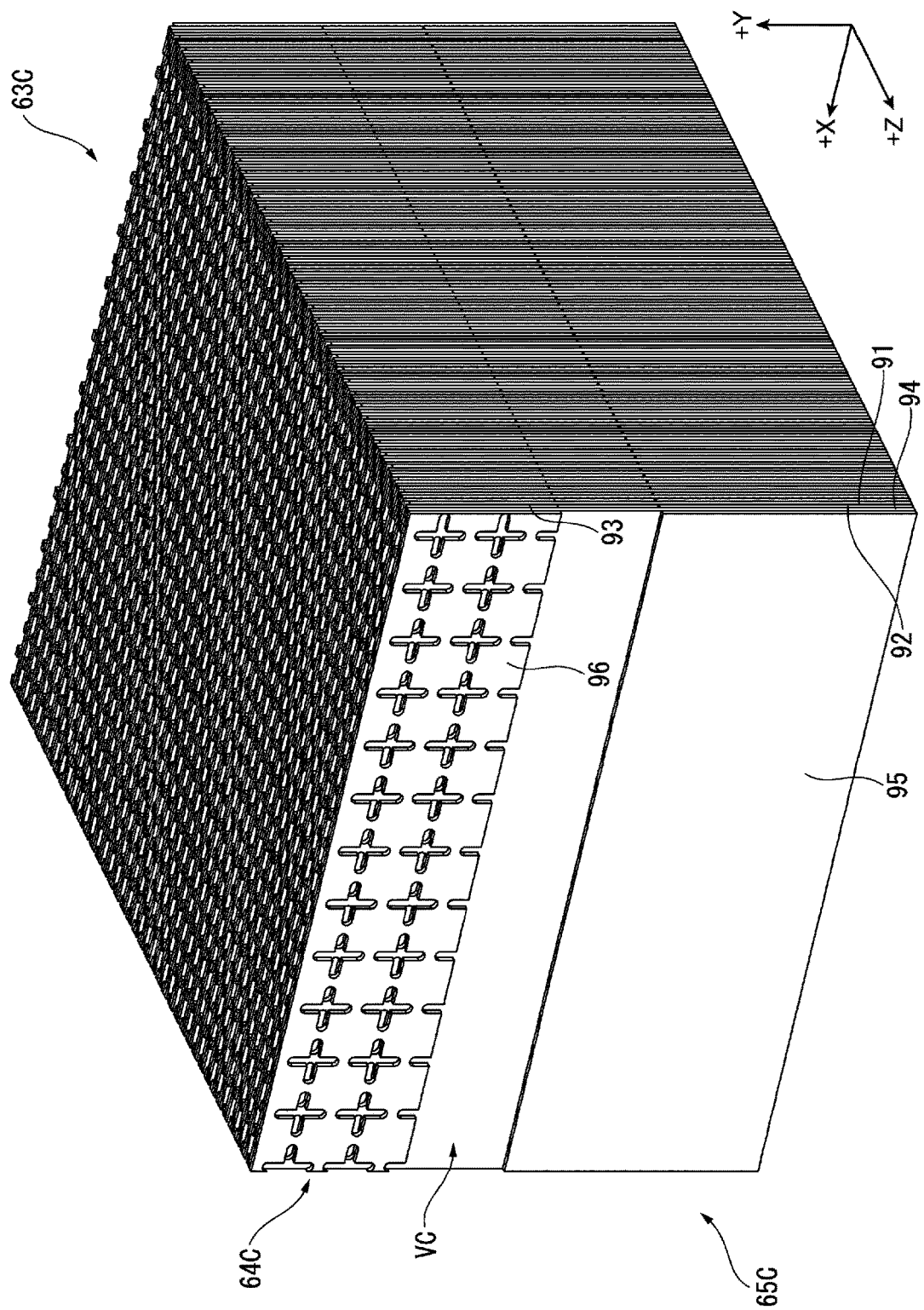
FIG. 12 is a perspective view showing a vapor generator provided to a projector according to a third embodiment.

FIG. 12 is a perspective view showing the vapor generator 63C provided to the projector according to the present embodiment.

The projector according to the present embodiment has substantially the same configuration and functions as those of the projector 1 except the point that the projector according to the present embodiment is provided with the vapor generator 63C instead of the vapor generator 63A. In other words, the evaporator 6 of the cooling device according to the present embodiment is provided with the housing 61, the reservoir 62, and the heat receiving member 66, and the vapor generator 63C shown in FIG. 12.

The vapor generator 63C has a wick 64C and a groove member 65C integrated with each other similarly to the vapor generator 63B. In other words, the wick 64C and the groove member 65C are integrated with each other. The wick 64C is located at the +Y direction side in the vapor generator 63C, and the groove member 65C is located at the −Y direction side in the vapor generator 63C.

Such a vapor generator 63C has first plate members 91, second plate members 92, third plate member 93, fourth plate members 94, fifth plate members 95, and sixth plate members 96 each of which is a metal plate. Further, the vapor generator 63C has a structure in which the second plate member 92 and the third plate member 93 are stacked in the +Z direction on the first plate member 91, the fourth plate member 94 is stacked in the +Z direction on the second plate member 92 and the third plate member 93, and the fifth plate member 95 and the sixth plate member 96 are stacked in the +Z direction on the fourth plate member 94 to form a configuration, and a plurality of the configurations is stacked on one another along the +Z direction.

In each of the first through sixth plate members 91 through 96, the dimension in the +X direction is substantially the same, and the dimension in the +Z direction is substantially the same. In other words, the width dimensions of the first through sixth plate members 91 through 96 are substantially the same as each other, and the thickness dimensions of the first through sixth plate members 91 through 96 are substantially the same as each other.

On the other hand, the dimensions in the +Y direction in the first plate member 91 and the fourth plate member 94 are substantially the same as each other, the dimensions in the +Y direction in the second plate member 92 and the fifth plate member 95 are substantially the same as each other, and the dimensions in the +Y direction in the third plate member 93 and the sixth plate member 96 are substantially the same as each other. Further, the dimensions in the +Y direction in the first plate member 91 and the fourth plate member 94 are larger than the dimensions in the +Y direction in the second plate member 92 and the fifth plate member 95, and the dimensions in the +Y direction in the second plate member 92 and the fifth plate member 95 are larger than the dimensions in the +Y direction in the third plate member 93 and the sixth plate member 96.

Further, the second plate member 92 is disposed at a position at the −Y direction side in the first plate member 91 and the fourth plate member 94 between the first plate member 91 and the fourth plate member 94 located at the +Z direction side of the first plate member 91 so that the second plate member 92 coincides with the first plate member 91 and the fourth plate member 94 in end edge in the −Y direction.

The third plate member 93 is disposed at a position at the +Y direction side in the first plate member 91 and the fourth plate member 94 between the first plate member 91 and the fourth plate member 94 so that the third plate member 93 coincides with the first plate member 91 and the fourth plate member 94 in end edge in the +Y direction.

The fifth plate member 95 is disposed at a position at the −Y direction side in the fourth plate member 94 and the first plate member 91 between the fourth plate member 94 and the first plate member 91 located at the +Z direction side of the fourth plate member 94 so that the fifth plate member 95 coincides with the fourth plate member 94 and the first plate member 91 in end edge in the −Y direction.

The sixth plate member 96 is disposed at a position at the +Y direction side in the fourth plate member 94 and the first plate member 91 between the fourth plate member 94 and the first plate member 91 so that the sixth plate member 96 coincides with the fourth plate member 94 and the first plate member 91 in end edge in the +Y direction.

The first plate member 91 and the fourth plate member 94 each correspond to a first metal plate, the second plate member 92 and the fifth plate member 95 each correspond to a second metal plate, and the third plate member 93 and the sixth plate member 96 each correspond to a third metal plate. Further, the thermal conductivity of the first plate member 91 and the thermal conductivity of the fourth plate member 94 are higher than the thermal conductivity of each of the second, third, fifth, and sixth plate members 92, 93, 95, and 96.

Figure 13:
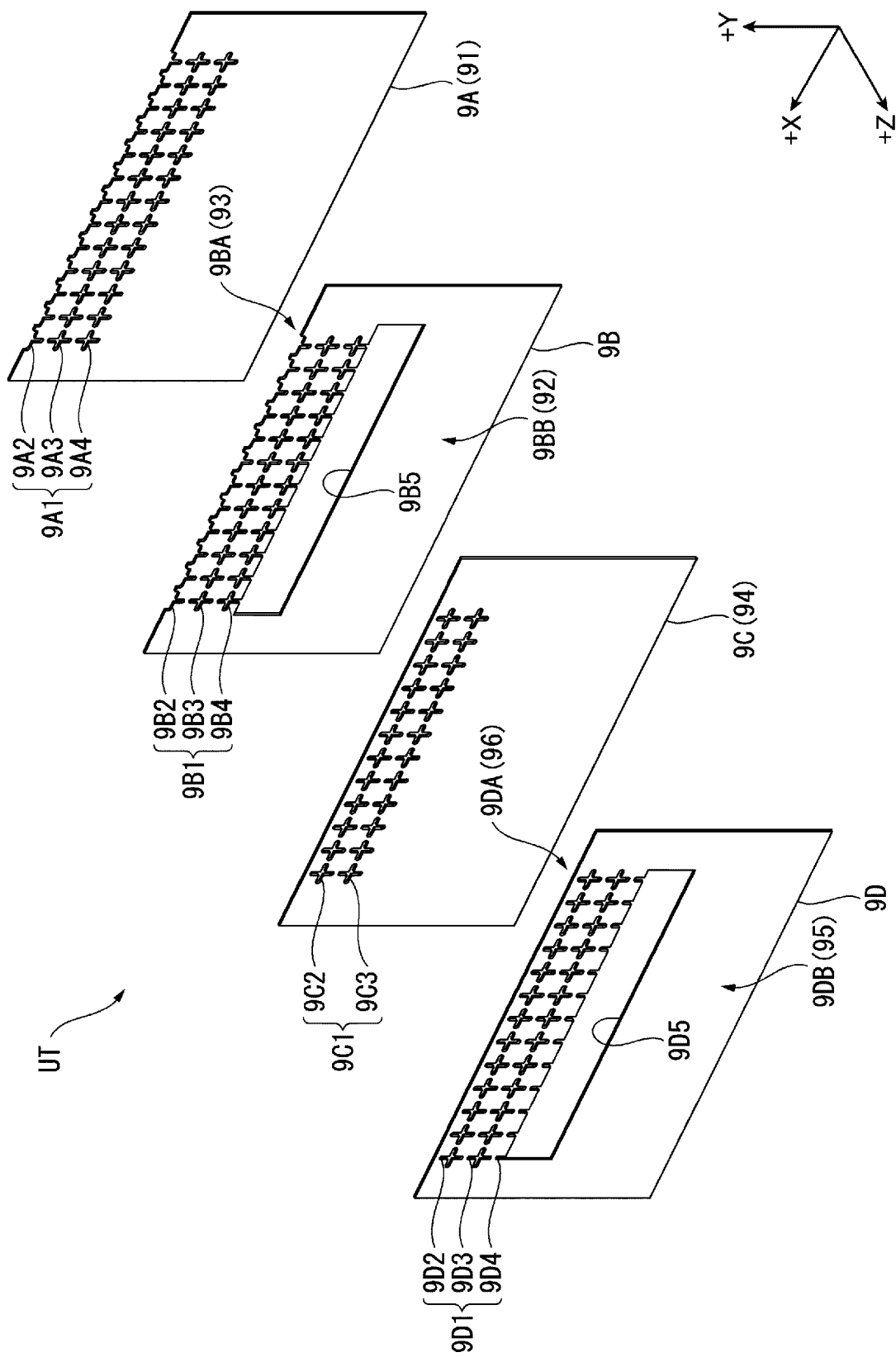
FIG. 13 is an exploded perspective view showing a vapor generating unit in the third embodiment.

FIG. 13 is an exploded perspective view of a vapor generating unit UT constituting the vapor generator 63C. Further, FIG. 14 is a plan view of the vapor generating unit UT viewed from the +Z direction, and is a diagram showing the positions of the cutting lines LD, LE set to the vapor generating unit UT in the detailed description.

Figure 14:
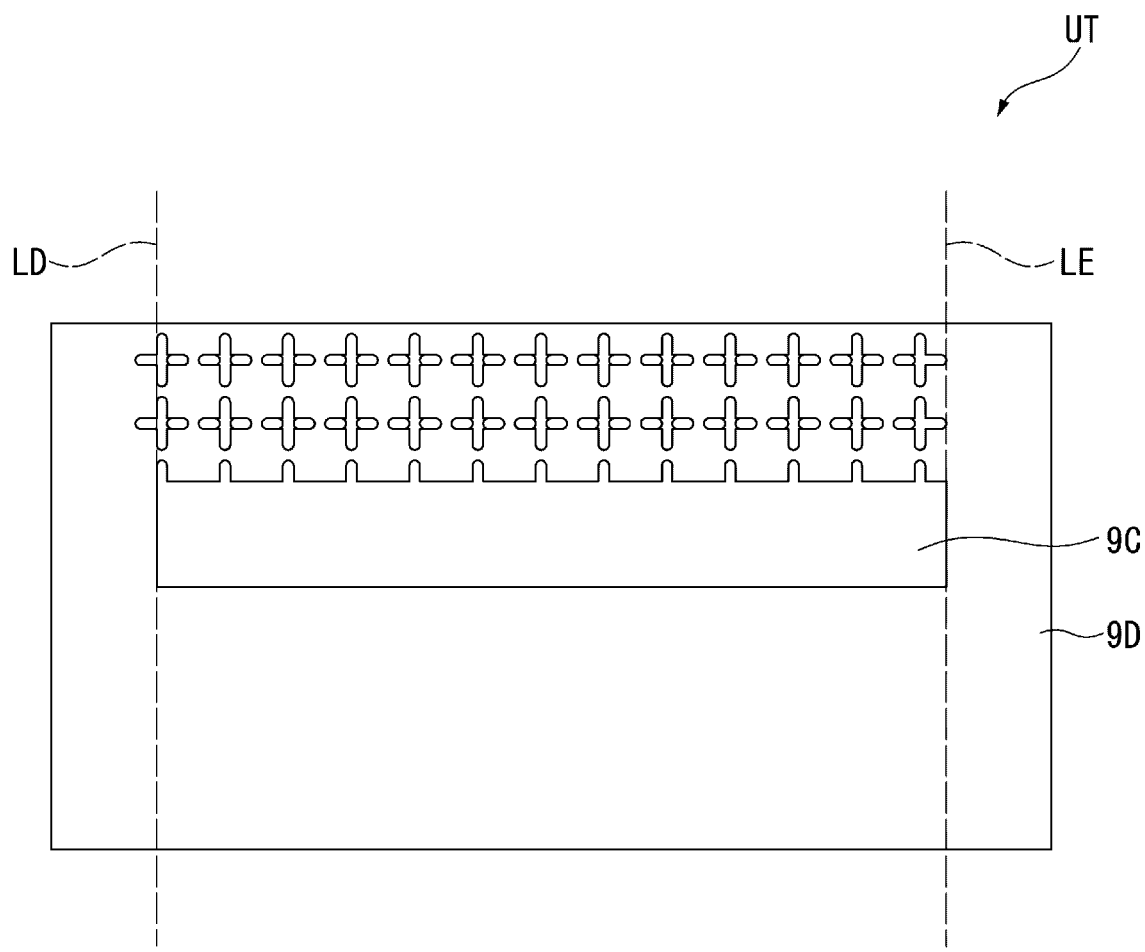
FIG. 14 is a diagram showing the vapor generating unit in the third embodiment.

The vapor generator 63C is configured by stacking a plurality of the vapor generating units UT shown in FIG. 13 on one another along the +Z direction, and then being cut along the cutting lines LD, LE shown in FIG. 14. The cutting lines LD, LE are cutting lines along the +Y direction, and the cutting line LD is set at the +X direction side in the vapor generating unit UT, and the cutting line LE is set at the −Y direction side in the vapor generating unit UT.

The vapor generating unit UT has a first substrate 9A, a second substrate 9B, a third substrate 9C, and a fourth substrate 9D. Further, the vapor generating unit UT is configured by stacking the first substrate 9A, the second substrate 9B, the third substrate 9C, and the fourth substrate 9D on one another along the +Z direction, and then bonding these substrates to each other with the diffusion bonding or the like.

By cutting the vapor generating unit UT along the cutting lines LD, LE, the first substrate 9A forms the first plate member 91, the second substrate 9B forms the second plate member 92 and the third plate member 93. Similarly, the third substrate 9C forms the fourth plate member 94, and the fourth substrate 9D forms the fifth plate member 95 and the sixth plate member 96.

As shown in FIG. 13, the first substrate 9A, the second substrate 9B, the third substrate 9C, and the fourth substrate 9D are each a thin plate made of metal formed to have a substantially rectangular shape in which a dimension along the +X direction is longer than a dimension along the +Y direction when viewed from the +Z direction.

The dimensions along the +Y direction of the substrates 9A through 9D are substantially the same as each other. The dimensions along the +X direction of the substrates 9A through 9D are substantially the same as each other, and the dimensions along the +Z direction of the substrates 9A through 9D are substantially the same as each other. In other words, the height dimension, the width dimension, and the thickness dimension are substantially the same between the substrates 9A through 9D.

The first substrate 9A has a transport flow channel forming section 9A1 for forming the transport flow channels RF for transporting the working fluid in the liquid phase in the −Y direction in the vapor generator 63C. The transport flow channel forming section 9A1 includes a plurality of opening parts 9A2, a plurality of opening parts 9A3, and a plurality of opening parts 9A4.

The opening parts 9A2 are formed at regular intervals along the +X direction on an end edge in the +Y direction in the first substrate 9A. The opening parts 9A2 are each a recessed part opening toward the +Y direction viewed from the +Z direction, and each penetrate the first substrate 9A along the +Z direction.

The plurality of opening parts 9A3 is located at a predetermined distance in the −Y direction with respect to the plurality of opening parts 9A2. The opening parts 9A3 are formed at regular intervals along the +X direction, and each penetrate the first substrate 9A along the +Z direction.

The plurality of opening parts 9A4 is located at a predetermined distance in the −Y direction with respect to the plurality of opening parts 9A3. The opening parts 9A4 are formed at regular intervals along the +X direction, and each penetrate the first substrate 9A along the +Z direction.

Further, one of the opening parts 9A2, one of the opening parts 9A3, and one of the opening parts 9A4 are arranged along the +Y direction.

Each of the opening parts 9A3, 9A4 is formed to have a cruciform shape having a first side edge along the +X direction and a second side edge along the +Y direction when viewed from the +Z direction.

Further, each of the opening parts 9A2 is formed to have a shape corresponding to a lower half of the cruciform shape the same in size as the opening part 9A3 when viewed from the +Z direction. In other words, each of the opening parts 9A2 has the first side edge along the +X direction and the second side edge along the +Y direction, and the second side edge extends toward the −Y direction from the center in the +X direction in the first side edge.

The second substrate 9B has a transport flow channel forming section 9B1 for forming the transport flow channels RF, and a vapor flow channel forming section 9B5 which is located on the −Y direction side with respect to the transport flow channel forming section 9B1, and forms the vapor flow channel VC.

The transport flow channel forming section 9B1 has a plurality of opening parts 9B2 each formed to have the same shape and the same dimensions as those of the opening parts 9A2, and a plurality of opening parts 9B3 and a plurality of opening parts 9B4 each formed to have the same shape and the same dimensions as those of the opening parts 9A3.

The opening parts 9B2 are formed at regular intervals along the +X direction on an end edge in the +Y direction in the second substrate 9B. The opening parts 9B2 are each a recessed part opening toward the +Y direction viewed from the +Z direction, and each penetrate the second substrate 9B along the +Z direction.

The plurality of opening parts 9B3 is located at a predetermined distance in the −Y direction with respect to the plurality of opening parts 9B2. The opening parts 9B3 are formed at regular intervals along the +X direction, and each penetrate the second substrate 9B along the +Z direction.

The plurality of opening parts 9B4 is located at a predetermined distance in the −Y direction with respect to the plurality of opening parts 9B3. The opening parts 9B4 are formed at regular intervals along the +X direction, and each penetrate the second substrate 9B along the +Z direction.

Further, one of the opening parts 9B2, one of the opening parts 9B3, and one of the opening parts 9B4 are arranged along the +Y direction.

The vapor flow channel forming section 9B5 is an opening part having a substantially rectangular shape in which the dimension along the +X direction is longer than the dimension along the +Y direction when viewed from the +Z direction as a normal direction of the second substrate 9B. The end edge in the +Y direction forming the vapor flow channel forming section 9B5 is coupled to an end part in the −Y direction in each of the opening parts 9B4. In other words, the vapor flow channel forming section 9B5 is communicated with the opening parts 9B4 constituting the transport flow channel forming section 9B1.

The cutting line LD shown in FIG. 14 is set along the end edge in the +X direction, and the cutting line LE is set along the end edge in the −X direction out of a pair of end edges along the +Y direction in the vapor flow channel forming section 9B5. Therefore, by cutting the vapor generating unit UT along the cutting lines LD, LE, the second substrate 9B is divided into an area 9BA at the +Y direction side with respect to the vapor flow channel forming section 9B5 and an area 9BB at the −Y direction side with respect to the vapor flow channel forming section 9B5.

Further, in the vapor generator 63C, the area 9BB forms the second plate member 92, and the area 9BA forms the third plate member 93. In other words, the third plate member 93 has the transport flow channel forming section 9B1, and the second plate member 92 and the third plate member 93 are stacked on the first plate member 91 at a distance in the +Y direction.

It should be noted that the vapor flow channel forming section 9B5 is a region for forming the vapor flow channel VC extending in the +X direction by cutting the vapor generating unit UT along the cutting lines LD, LE. The dimension in the +Y direction in the vapor flow channel forming section 9B5 is larger than the dimension in the +Z direction in the second substrate 9B. Therefore, when viewing the cross-sectional surface along the Y-Z plane in the vapor flow channel VC formed of the vapor flow channel forming section 9B5, namely the cross-sectional surface perpendicular to the direction in which the vapor flows through the vapor flow channel VC, along the +X direction, the dimension along the +Y direction is larger than the dimension along the +Z direction.

The third substrate 9C has a transport flow channel forming section 9C1 for forming the transport flow channels RF.

The transport flow channel forming section 9C1 has a plurality of opening parts 9C2 and a plurality of opening parts 9C3 each formed to have substantially the same shape and dimensions as those of the opening parts 9A3.

The plurality of opening parts 9C2 is located at a predetermined distance in the −Y direction from the end edge in the +Y direction in the third substrate 9C. The opening parts 9C2 are formed at regular intervals along the +X direction, and each penetrate the third substrate 9C along the +Z direction.

The plurality of opening parts 9C3 is located at a predetermined distance in the −Y direction with respect to the plurality of opening parts 9C2. The opening parts 9C3 are formed at regular intervals along the +X direction, and each penetrate the third substrate 9C along the +Z direction.

Further, one of the opening parts 9C2 and one of the opening parts 9C3 are arranged along the +Y direction.

The fourth substrate 9D has a transport flow channel forming section 9D1 for forming the transport flow channels RF, and a vapor flow channel forming section 9D5 which is located at the −Y direction side with respect to the transport flow channel forming section 9D1, and forms the vapor flow channel VC.

The transport flow channel forming section 9D1 has a plurality of opening parts 9D2 and a plurality of opening parts 9D3 each formed to have substantially the same shape and dimensions as those of the opening parts 9A3, and a plurality of opening parts 9D4.

The plurality of opening parts 9D2 is located at a predetermined distance in the −Y direction from the end edge in the +Y direction in the fourth substrate 9D. The opening parts 9D2 are formed at regular intervals along the +X direction, and each penetrate the fourth substrate 9D along the +Z direction.

The plurality of opening parts 9D3 is located at a predetermined distance in the −Y direction with respect to the plurality of opening parts 9D2. The opening parts 9D3 are formed at regular intervals along the +X direction, and each penetrate the fourth substrate 9D along the +Z direction.

The opening parts 9D4 are located at a predetermined distance in the −Y direction with respect to the plurality of opening parts 9D3, and each formed to have a linear shape along the +Y direction. The opening parts 9D4 are formed at regular intervals along the +X direction, and each penetrate the fourth substrate 9D along the +Z direction, and are further communicated with the vapor flow channel forming section 9D5.

Further, one of the opening parts 9D2, one of the opening parts 9D3, and one of the opening parts 9D4 are arranged along the +Y direction.

The vapor flow channel forming section 9D5 is an opening part having a substantially rectangular shape in which the dimension along the +X direction is longer than the dimension along the +Y direction when viewed from the +Z direction as a normal direction of the fourth substrate 9D. The end edge in the +Y direction forming the vapor flow channel forming section 9D5 is coupled to an end part in the −Y direction in each of the opening parts 9D4. In other words, the vapor flow channel forming section 9D5 is communicated with the opening parts 9D4 constituting the transport flow channel forming section 9D1.

Further, the cutting line LD described above is set along the end edge in the +X direction, and the cutting line LE described above is set along the end edge in the −X direction out of a pair of end edges along the +Y direction in the vapor flow channel forming section 9D5. Therefore, by cutting the vapor generating unit UT along the cutting lines LD, LE, the fourth substrate 9D is divided into an area 9DA at the +Y direction side with respect to the vapor flow channel forming section 9D5 and an area 9DB on the −Y direction side with respect to the vapor flow channel forming section 9D5.

In the vapor generator 63C, the area 9DB forms the fifth plate member 95, and the area 9DA forms the sixth plate member 96. In other words, the sixth plate member 96 has the transport flow channel forming section 9D1, and the fifth plate member 95 and the sixth plate member 96 are stacked on the fourth plate member 94 at a distance in the +Y direction.

It should be noted that similarly to the vapor flow channel forming section 9B5, the vapor flow channel forming section 9D5 is a region for forming the vapor flow channel VC extending in the +X direction by cutting the vapor generating unit UT along the cutting lines LD, LE. The dimension in the +Y direction in the vapor flow channel forming section 9D5 is larger than the dimension in the +Z direction in the fourth substrate 9D. Therefore, when viewing the cross-sectional surface along the Y-Z plane in the vapor flow channel VC formed of the vapor flow channel forming section 9D5, namely the cross-sectional surface perpendicular to the direction in which the vapor flows through the vapor flow channel VC, along the +X direction, the dimension along the +Y direction is larger than the dimension along the +Z direction.

Arrangement of Transport Flow Channel Forming Sections

Figure 15:
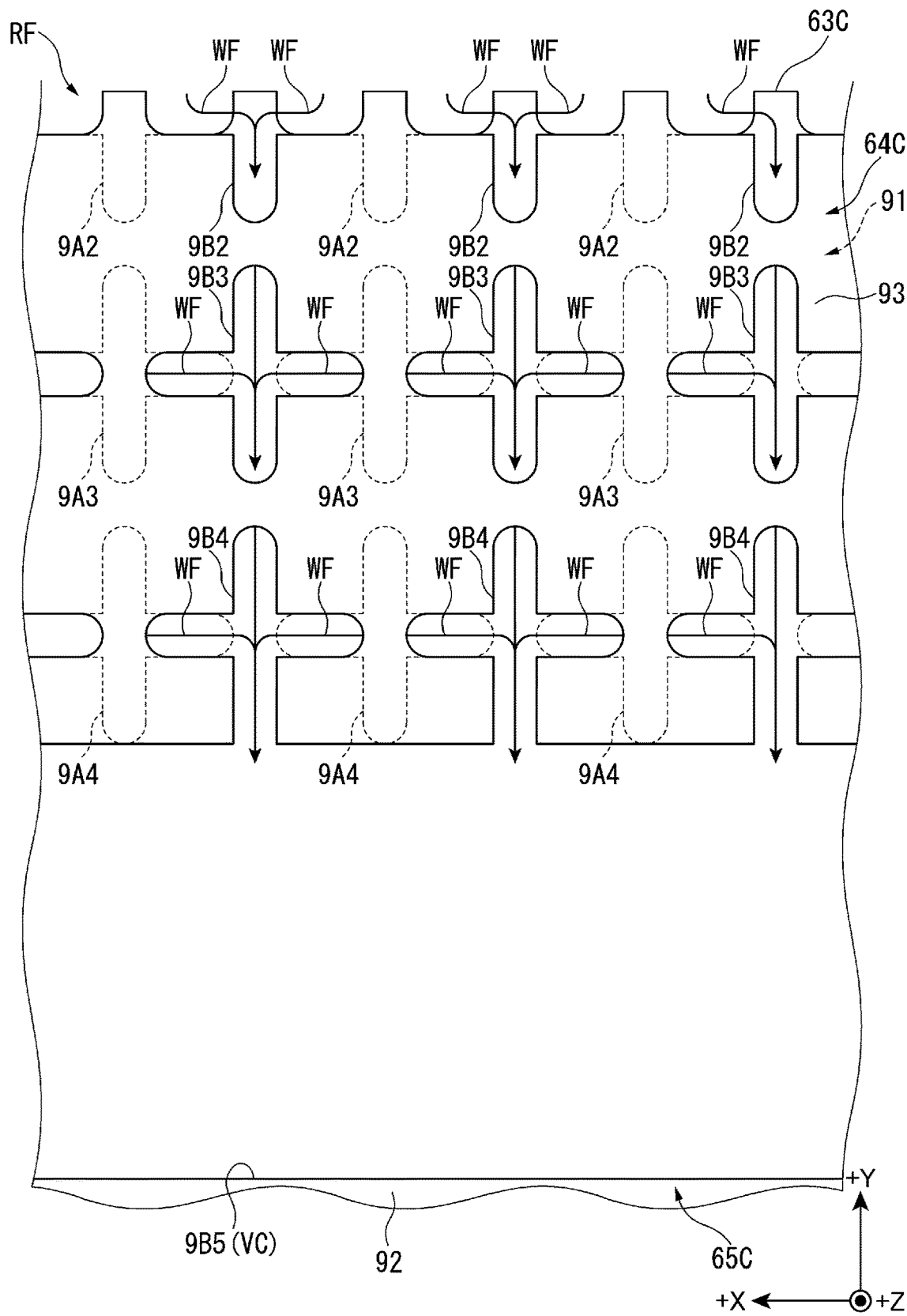
FIG. 15 is a diagram showing first through third plate members in the third embodiment.
Figure 16:
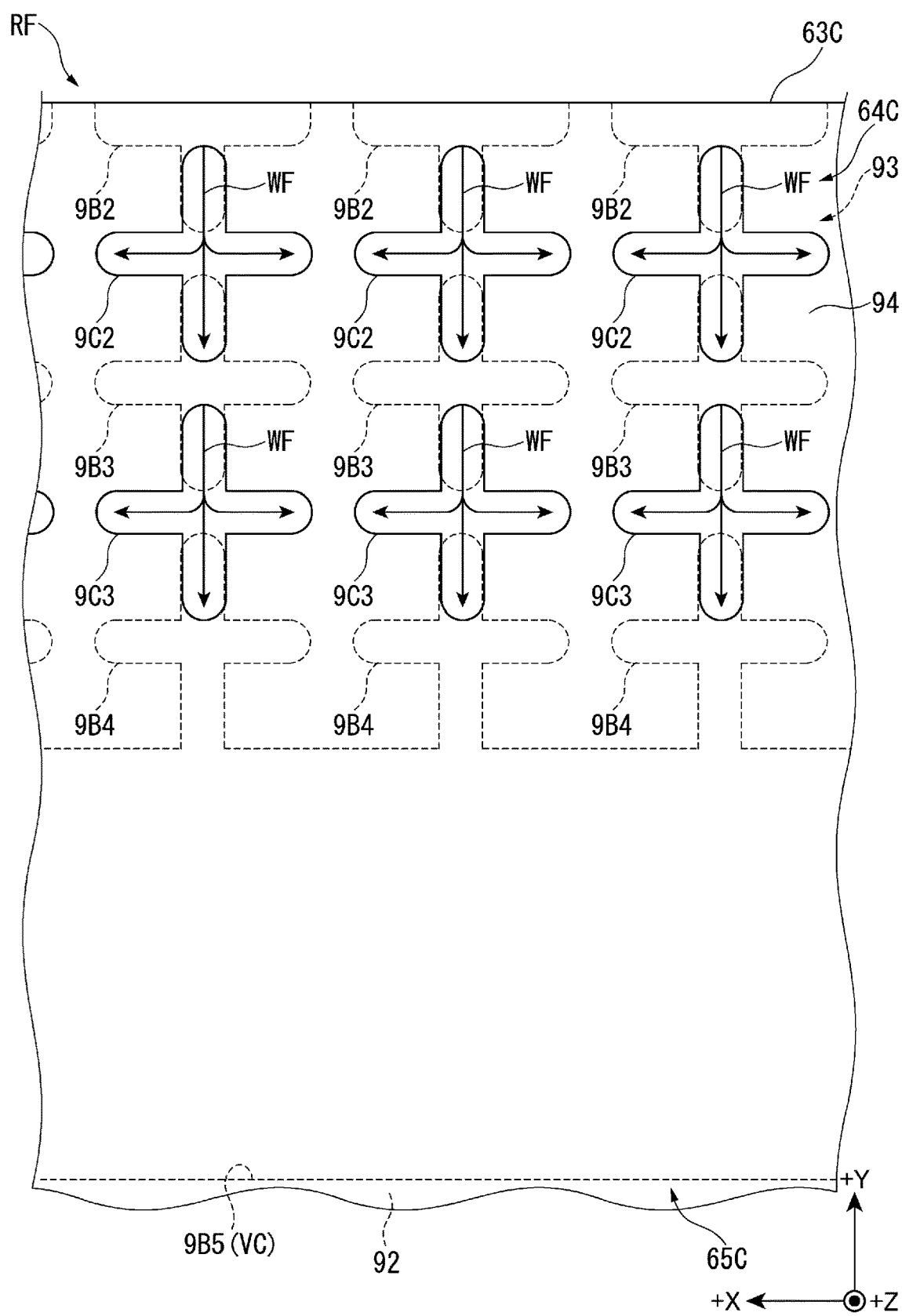
FIG. 16 is a diagram showing second through fourth plate members in the third embodiment.
Figure 17:
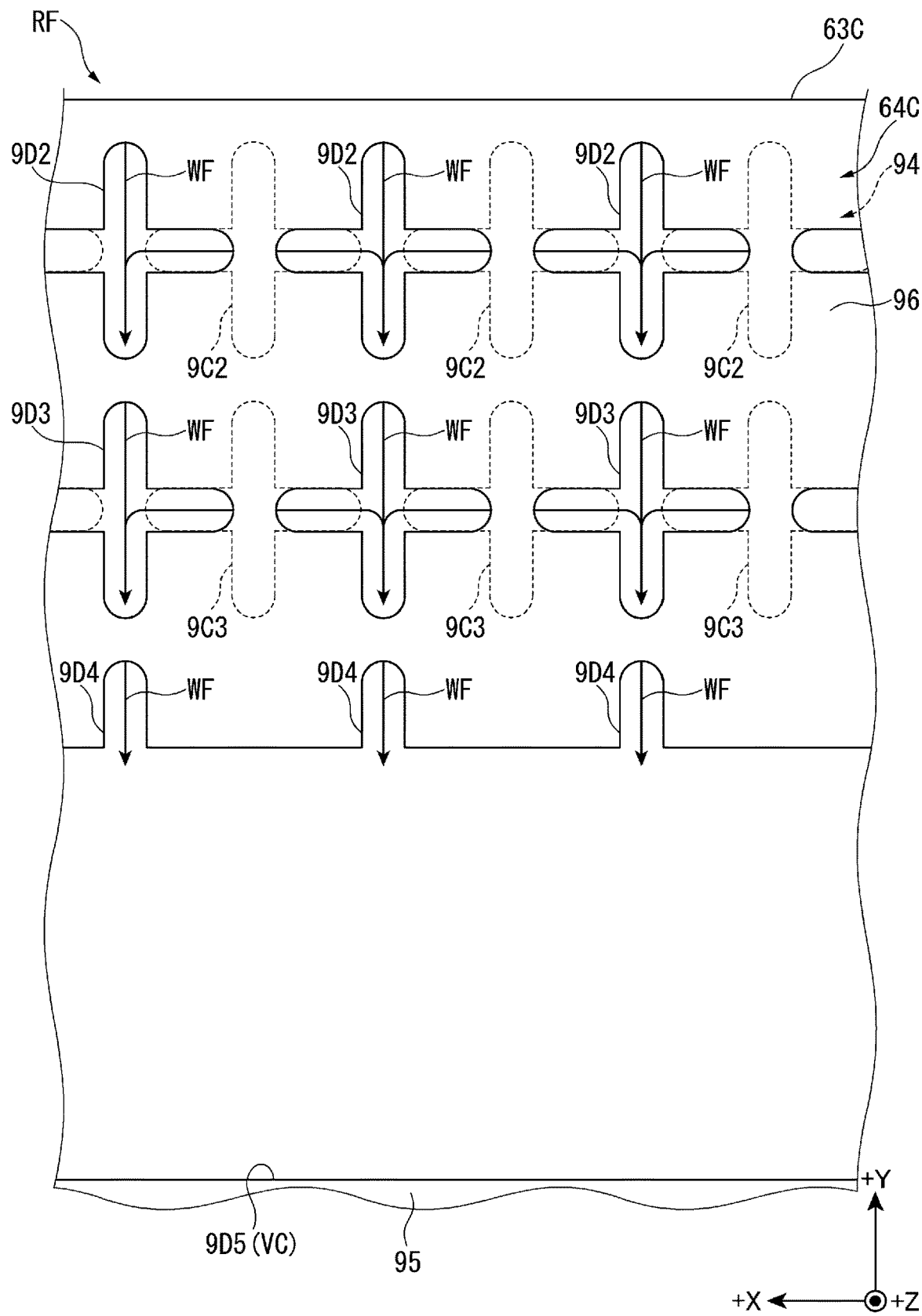
FIG. 17 is a diagram showing fourth through sixth plate members in the third embodiment.
Figure 18:
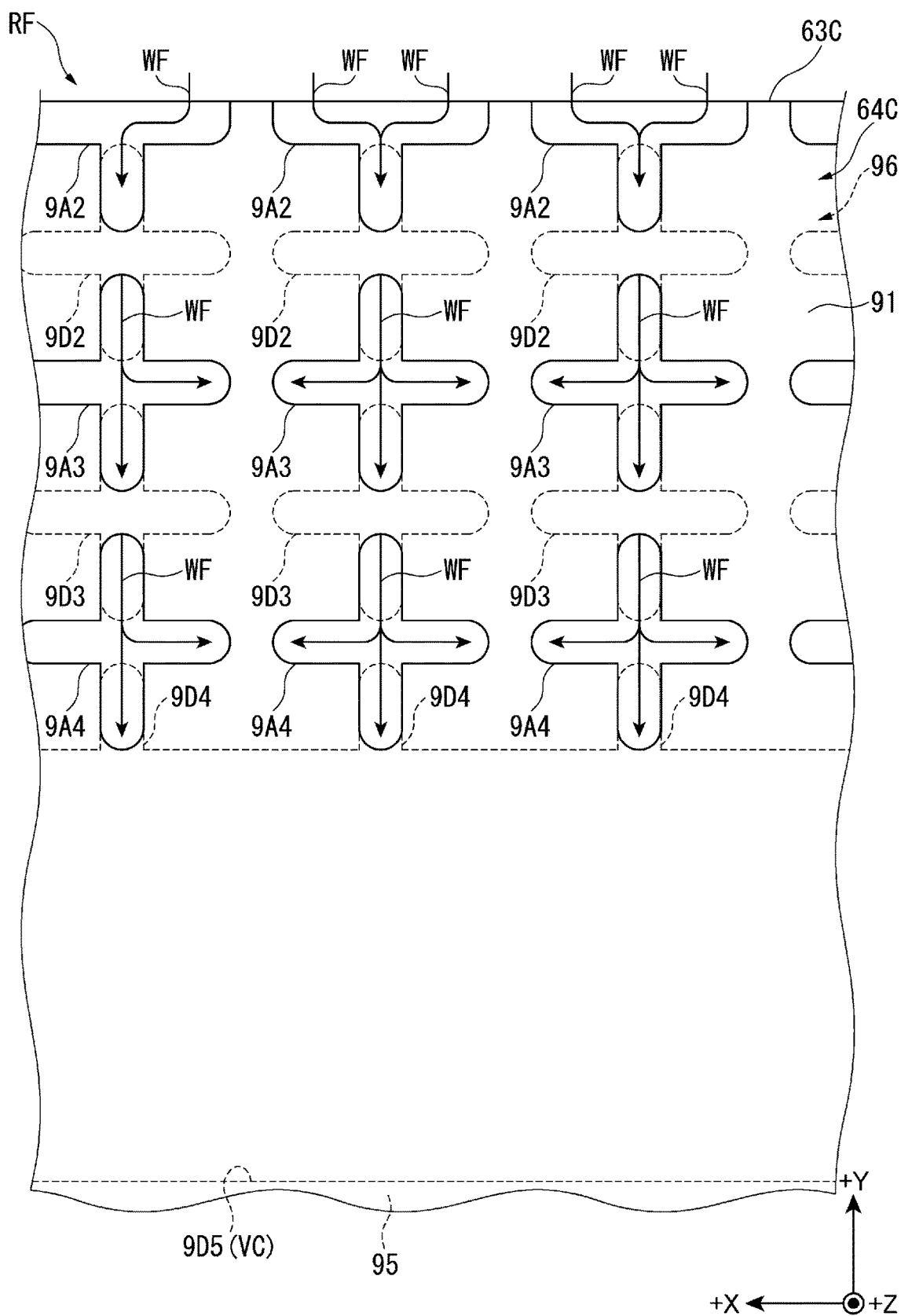
FIG. 18 is a diagram showing first, fifth, and sixth plate members in the third embodiment.

FIG. 15 is a plan view of the first through third plate members 91 through 93 bonded to each other viewed from the second plate member 92 and the third plate member 93 side. FIG. 16 is a plan view of the second through fourth plate members 92 through 94 viewed from the fourth plate member 94 side. FIG. 17 is a plan view of the fourth through sixth plate members 94 through 96 viewed from the fifth plate member 95 and the sixth plate member 96 side. FIG. 18 is a plan view of the fifth plate member 95, the sixth plate member, and the first plate member 91 viewed from the first plate member 91 side. It should be noted that in FIG. 15 through FIG. 18, out of the configurations of the plate members located in the +Z direction, the configurations which are not visually recognized when viewed from the +Z direction are represented by the dotted lines.

In the vapor generator 63C, the first plate member 91 formed of the first substrate 9A has the transport flow channel forming section 9A1 as shown in FIG. 15 and FIG. 18. The third plate member 93 formed of the second substrate 9B has the transport flow channel forming section 9B1 as shown in FIG. 15 and FIG. 16. The fourth plate member 94 formed of the third substrate 9C has the transport flow channel forming section 9C1 as shown in FIG. 16 and FIG. 17. The sixth plate member 96 formed of the fourth substrate 9D has the transport flow channel forming section 9D1 as shown in FIG. 17 and FIG. 18.

As shown in FIG. 15, each of the opening parts 9B2 is arranged so as to partially overlap the two opening parts 9A2 adjacent to each other in the +X direction out of the plurality of opening parts 9A2 when viewed from the +Z direction. Each of the opening parts 9B3 is arranged so as to partially overlap the two opening parts 9A3 adjacent to each other in the +X direction out of the plurality of opening parts 9A3 when viewed from the +Z direction. Further, each of the opening parts 9B4 is arranged so as to partially overlap the two opening parts 9A4 adjacent to each other in the +X direction out of the plurality of opening parts 9A4 when viewed from the +Z direction.

As shown in FIG. 16, each of the opening parts 9C2 is arranged so as to partially overlap the opening parts 9B2 and the opening part 9B3 arranged side by side along the +Y direction when viewed from the +Z direction. Similarly, each of the opening parts 9C3 is arranged so as to partially overlap the opening part 9B3 and the opening part 9B4 arranged side by side along the +Y direction when viewed from the +Z direction.

As shown in FIG. 17, each of the opening parts 9D2 is arranged so as to partially overlap the two opening parts 9C2 adjacent to each other in the +X direction out of the plurality of opening parts 9C2 when viewed from the +Z direction. Each of the opening parts 9D3 is arranged so as to partially overlap the two opening parts 9C3 adjacent to each other in the +X direction out of the plurality of opening parts 9C3 when viewed from the +Z direction.

As shown in FIG. 18, the opening parts 9A2 are arranged so as to partially overlap the respective opening parts 9D2 when viewed from the +Z direction. Each of the opening parts 9A3 is arranged so as to partially overlap the opening part 9D2 and the opening part 9D3 arranged side by side along the +Y direction when viewed from the +Z direction. Further, each of the opening parts 9A4 is arranged so as to partially overlap the opening part 9D3 and the opening part 9D4 arranged side by side along the +Y direction when viewed from the +Z direction.

As described above, the wick 64C constituted by the first through fourth plate members 91 through 94 stacked on one another along the +Z direction has the transport flow channels RF which are constituted by the transport flow channel forming sections 9A1, 9B1, 9C1, and 9D1 stacked on one another, and transport the working fluid WF in the liquid phase from the reservoir 62 toward the −Y direction.

Flow of Working Fluid in Liquid Phase Flowing Through Transport Flow Channels

Hereinafter, the flow pathway of the working fluid WF in the liquid phase flowing through the transport flow channels RF provided to the wick 64C will be described using FIG. 15 through FIG. 18.

As shown in FIG. 15, in the wick 64C, the working fluid WF in the liquid phase retained in the reservoir 62 is sucked into the opening parts 9B2 opening toward the +Y direction due to the capillary force.

The working fluid WF in the liquid phase having flowed into the opening parts 9B2 flows into the opening parts 9C2 as shown in FIG. 16. A part of the working fluid WF in the liquid phase having flowed into the opening parts 9C2 flows into the opening parts 9B3, and another part thereof flows into the opening parts 9D2 as shown in FIG. 17.

Further, as shown in FIG. 18, in the wick 64C, the working fluid WF in the liquid phase retained in the reservoir 62 is sucked into the opening parts 9A2 opening toward the +Y direction due to the capillary force. Then, the working fluid WF in the liquid phase having flowed into the opening parts 9A2 flows into the opening parts 9D2.

The working fluid WF in the liquid phase having flowed into the opening parts 9D2 flows into the opening parts 9A3 as shown in FIG. 18. A part of the working fluid WF in the liquid phase having flowed into the opening parts 9A3 flows into the opening parts 9D3, and another part thereof flows into the opening parts 9B3 as shown in FIG. 15.

The working fluid WF in the liquid phase having flowed into the opening parts 9B3 flows into the opening parts 9C3 as shown in FIG. 16. A part of the working fluid WF in the liquid phase having flowed into the opening parts 9C3 flows into the opening parts 9B4, and another part thereof flows into the opening parts 9D3 as shown in FIG. 17.

The working fluid WF in the liquid phase having flowed into the opening parts 9D3 flows into the opening parts 9A4 as shown in FIG. 18. A part of the working fluid WF having flowed into the opening parts 9A4 flows toward the vapor flow channels VC formed of the vapor flow channel forming section 9D5 via the opening parts 9D4 as shown in FIG. 17 and FIG. 18.

The working fluid WF having flowed into the opening parts 9B4 flows toward the vapor flow channels VC formed of the vapor flow channel forming section 9B5 via the opening parts 9B4 as shown in FIG. 15 and FIG. 16.

As described above, the working fluid WF in the liquid phase flows through the transport flow channels RF provided to the wick 64C due to the capillary force to thereby be transported from the reservoir 62 toward the groove member 65C.

Advantages of Third Embodiment

According to the projector related to the present embodiment described hereinabove, in addition to the advantages substantially the same as those of the projector described in the second embodiment, the following advantages can be exerted.

That is, the wick 64C is constituted by alternately stacking the plurality of sets of the first plate member 91 and the fourth plate member 94 each of which is the first metal plate, and the plurality of sets of the third plate member 93 and the sixth plate member 96 as the third metal plate disposed in accordance with the region at the reservoir 62 side in the first plate member 91 and the fourth plate member 94 along the +Z direction as the second direction. The third plate member 93 and the sixth plate member 96 are combined with the first plate member 91 and the fourth plate member 94, respectively, to thereby form the transport flow channels RF for transporting the working fluid WF in the liquid phase retained in the reservoir 62 in the −Y direction as an opposite direction to the first direction.

According to this configuration, it is possible to surely transport the working fluid WF in the liquid phase retained in the reservoir 62 toward the groove member 65C using the capillary force by the transport flow channels RF provided to the wick 64C, and in addition, it is possible to simplify the configuration of the wick 64C to be integrated with the groove member 65C. Therefore, it is possible to simplify the configuration of the evaporator 6, and by extension, the cooling device 5.

Modifications of Embodiments

The present disclosure is not limited to each of the embodiments described above, but includes modifications, improvements, and so on within the range in which the advantages of the present disclosure can be achieved.

In the first embodiment described above, it is assumed that the thermal conductivity of the first metal plates 71 is higher than the thermal conductivity of the second metal plates 72. In the second embodiment described above, it is assumed that the thermal conductivity of the first metal plates 81 is higher than the thermal conductivity of the second metal plates 82 and the thermal conductivity of the third metal plates 83. In the third embodiment described above, it is assumed that the thermal conductivity of the first plate member 91 as the first metal plate and the thermal conductivity of the fourth plate member 94 as the first metal plate are higher than the thermal conductivity of each of other plate members 92, 93, 95, and 96. However, these are not a limitation, and it is possible for the metal plates to be the same in thermal conductivity and it is possible for the plate members to be the same in thermal conductivity, and it is also possible for the thermal conductivity of the first metal plate to be lower than the thermal conductivity of other metal plates.

In the first embodiment described above, it is assumed that the dimension in the +Y direction in the first metal plates 71 is larger than the dimension in the +Y direction in the second metal plates 72. However, this is not a limitation, and providing the first metal plates 71 are coupled to the wick 64A, and the second metal plates 72 are arranged separately from the wick 64A out of the first metal plates 71 and the second metal plates 72 stacked on one another, it is also possible for the dimension in the +Y direction in the first metal plates 71 to be the same as the dimension in the +Y direction in the second metal plates 72, or to be smaller than the dimension in the +Y direction in the second metal plates 72. In other words, the end part in the −Y direction in the first metal plates 71 is not required to substantially coincide with the end part in the −Y direction in the second metal plates 72.

In the first embodiment described above, it is assumed that the dimension (the thickness dimension) in the +Z direction in the first metal plates 71 and the dimension in the +Z direction in the second metal plates 72 are substantially the same as each other. In the second embodiment described above, it is assumed that the dimensions in the +Z direction in the first metal plates 81, the second metal plates 82, and the third metal plates 83 are substantially the same as each other. In the third embodiment described above, it is assumed that the dimensions in the +Z direction in the first plate members 91, the second plate members 92, the third plate members 93, the fourth plate members 94, the fifth plate members 95, and the sixth plate members 96 are substantially the same as each other. However, this is not a limitation, the dimensions in the +Z direction in the respective metal plates can also be different from each other, and the dimensions in the +Z direction in the respective plate members can also be different from each other. For example, by adjusting the dimensions in the +Z direction in the second metal plates 72 disposed between the first metal plates 71, it is possible to adjust the aspect ratio of the vapor flow channel VC.

In the second embodiment described above, it is assumed that the transport flow channels RF extend linearly along the +Y direction. In the third embodiment described above, it is assumed that the transport flow channels RF are formed by the transport flow channel forming sections 9A1, 9B1, 9C1, and 9D1 including the opening parts each formed to have the cruciform shape viewed from the +Z direction. However, this is not a limitation, and it is also possible to arbitrarily change the shape of the transport flow channels RF and the flow pathway of the working fluid WF in the liquid phase flowing through the transport flow channels RF. In other words, as long as the working fluid WF in the liquid phase retained in the reservoir 62 can be transported toward the groove member due to the capillary force, the shape and the configuration of the transport flow channels RF can arbitrarily be changed.

In each of the embodiments described above, it is assumed that the heat receiving member 66 for making it easy to transfer the heat having been generated in the light source 411 to the groove member 65A, 65B, or 65C is disposed between the support member 414 of the light source 411 as the cooling target and the groove member 65A, 65B, or 65C. However, this is not a limitation, and it is also possible for the support member 414 and the groove member 65A, 65B, or 65C to be coupled to each other so as to be able to transfer heat without the intervention of the heat receiving member 66.

In the second embodiment described above, it is assumed that the vapor generator 63B having the first through third metal plates 81 through 83 is manufactured by stacking the first substrates 8A and the second substrates 8B, and then cutting the first substrates 8A and the second substrates 8B along the cutting lines LA, LB, and LC. In the third embodiment described above, it is assumed that the vapor generator 63C having the first through sixth plate members 91 through 96 is manufactured by stacking the first through fourth substrates 9A through 9D, and then cutting the first through fourth substrates 9A through 9D along the cutting lines LD, LE. However, this is not a limitation, and the manufacturing method of the vapor generator can also be other methods. For example, it is also possible to manufacture the vapor generator 63B by bonding the first metal plates 81, the second metal plates 82, and the third metal plates 83 to each other with the diffusion bonding or the like, or manufacture the vapor generator 63C by bonding the first through sixth plate members 91 through 96 to each other. Further, the bonding method can also be other methods than the diffusion bonding, and it is also possible to adopt, for example, brazing, soldering, spot welding, or swaging.

In each of the embodiments described above, it is assumed that the light source 411 of the light source device 4 has the semiconductor lasers 412, 413. However, this is not a limitation, and it is also possible for the light source device to be a device having a light source lamp such as a super-high pressure mercury lamp, or other solid-state light sources such as light emitting diodes (LED) as the light source. In this case, the cooling target of the loop heat pipe 51 can also be the light source lamp or other solid-state light sources.

In each of the embodiments described above, it is assumed that the projector is equipped with the three light modulation devices 343 (343B, 343G and 343R). However, this is not a limitation, and the present disclosure can also be applied to a projector equipped with two or less, or four or more light modulation devices.

In each of the embodiments described above, it is assumed that the light modulation devices 343 are each the transmissive type liquid crystal panel having the plane of incidence of light and the light exit surface different from each other. However, this is not a limitation, and it is also possible to use reflective liquid crystal panels having the plane of incidence of light and the light exit surface coinciding with each other as the light modulation devices. Further, it is also possible to use a light modulation device other than the liquid crystal device, such as a device using a micromirror such as a digital micromirror device (DMD) providing the light modulation device is capable of modulating the incident light beam to form the image corresponding to the image information.

In each of the embodiments described above, there is cited an example of applying the cooling device 5 equipped with the loop heat pipe 51 to the projector. However, this is not a limitation, and the cooling device according to the present disclosure can also be applied to other devices or equipment than the projector, and in addition, can also be used alone. In other words, the application of the cooling device according to the present disclosure is not limited to a device for cooling the constituents of the projector.

What is claimed is:

1. A cooling device comprising:
    an evaporator configured to evaporate working fluid in a liquid phase with a heat transferred from a cooling target to change to the working fluid in a vapor phase;
    a condenser configured to condense the working fluid in the vapor phase to change to the working fluid in the liquid phase;
    a vapor pipe configured to flow the working fluid changed to the vapor phase in the evaporator into the condenser; and
    a liquid pipe configured to flow the working fluid changed to the liquid phase in the condenser into the evaporator, wherein:
    the evaporator includes
        a housing coupled to the liquid pipe, the housing into which the working fluid in the liquid phase inflows, the housing having a reservoir configured to retain the working fluid in the liquid phase flowed into the housing,
        a wick disposed in the housing, the wick soaked with the working fluid in the liquid phase, the wick configured to transport the working fluid in the liquid phase,
        a groove member having a plurality of vapor flow channels through which the working fluid changed in phase from the liquid phase to the vapor phase flows, the groove member coupled to the wick,
    the groove member is constituted by alternately stacking, along a second direction perpendicular to a first direction from the groove member toward the reservoir,
        two or more first metal plates coupled to the wick and
        two or more second metal plates disposed at a larger distance from the wick than that of the first metal plate,
    one vapor flow channel is formed between one of the first metal plates and another of the first metal plates adjacent to the one of the first metal plates at the wick side of the groove member, and
    a dimension along the first direction is larger than a dimension along the second direction in a cross-sectional surface of each of the vapor flow channels when viewing the groove member along a direction perpendicular to both the first direction and the second direction.

2. The cooling device according to claim 1, wherein a thermal conductivity of the first metal plate is higher than a thermal conductivity of the second metal plate.

3. A projector comprising:
    a light source configured to emit light;
    a light modulator configured to modulate the light emitted from the light source;
    a projection optical device configured to project the light modulated by the light modulator; and
    the cooling device according to claim 2.

4. The cooling device according to claim 1, wherein the groove member and the wick are integrated with each other.

5. The cooling device according to claim 4, wherein:
    the wick is constituted by alternately stacking, along the second direction,
        the plurality of first metal plates and
        a plurality of third metal plates each disposed at a first direction side with respect to the second metal plate, and
    the third metal plates are combined with the first metal plates and form a plurality of transport flow channels configured to transport the working fluid in the liquid phase retained in the reservoir in an opposite direction to the first direction.

6. A projector comprising:
    a light source configured to emit light;
    a light modulator configured to modulate the light emitted from the light source;
    a projection optical device configured to project the light modulated by the light modulator; and
    the cooling device according to claim 5.

7. A projector comprising:
    a light source configured to emit light;
    a light modulator configured to modulate the light emitted from the light source;

a projection optical device configured to project the light modulated by the light modulator; and the cooling device according to claim 4.

8. A projector comprising:

a light source configured to emit light;

a light modulator configured to modulate the light emitted from the light source;

a projection optical device configured to project the light modulated by the light modulator; and the cooling device according to claim 1.

9. The projector according to claim 8, wherein the cooling target is the light source.

* * * * *